United States Patent [19]

Goodman

[11] Patent Number: 5,321,361
[45] Date of Patent: Jun. 14, 1994

[54] APPARATUS AND METHOD FOR DETECTING MAGNETICALLY DETECTABLE PLASTIC PIPE AND OTHER SOURCES OF MAGNETIC FIELDS FROM A DISTANCE USING A VERTICALLY ALIGNED GRADIOMETER ON A HORIZONTAL SUPPORT

[76] Inventor: William L. Goodman, 897 Independence Ave., Mountain View, Calif. 94043

[21] Appl. No.: 956,245

[22] Filed: Oct. 5, 1992

[51] Int. Cl.$^5$ .................. G01V 3/08; G01V 3/10; G01V 3/00; G01R 33/04
[52] U.S. Cl. .................. 324/326; 324/253; 324/345
[58] Field of Search ............ 324/326, 327, 328, 329, 324/345, 253, 254, 255

[56] References Cited

U.S. PATENT DOCUMENTS

| | | | |
|---|---|---|---|
| 4,427,943 | 1/1984 | Cloutier et al. | 324/243 |
| 5,001,430 | 3/1991 | Peterman et al. | 324/326 |

*Primary Examiner*—Walter E. Snow
*Attorney, Agent, or Firm*—Neal J. Mosely

[57] ABSTRACT

An apparatus is disclosed for manipulation by an operator or user for detecting magnetically detectable plastic pipe and other sources of magnetic fields from a distance having a horizontally oriented support member with a handle extending at an acute angle therefrom. A magnetic field gradiometer comprising a hollow non-magnetic tube with two flux-gate magnetometers therein is supported at the distal end of the support member a substantial distance ahead of the operator in a substantially vertical position. A microprocessor is supported on the support member operatively connected through a differential amplifier to the gradiometer for processing signals therefrom. An electronic read-out module is supported on the handle spaced from the gradiometer and operable to receive signals from the microprocessor and convert them into an audible or visual display to be sensed by the operator or user. The size and weight distribution of the apparatus and the angles at which the components are assembled assure that when the apparatus is hand held by the handle the gradiometer is balanced in a vertical position at a substantial distance ahead of the operator or user. An alternate embodiment, i.e., a magnetic field mapper, is shown having a plurality of gradiometers supported in parallel on supporting wheels and having the visual and audio display in the form of a laptop or notebook type computer supported on the handle for the wheeled apparatus. A hand held embodiment of the mapper is also disclosed.

18 Claims, 14 Drawing Sheets

APPARATUS AND METHOD FOR DETECTING MAGNETICALLY DETECTABLE PLASTIC PIPE AND OTHER SOURCES OF MAGNETIC FIELDS FROM A DISTANCE USING A VERTICALLY ALIGNED GRADIOMETER ON A HORIZONTAL SUPPORT

FIELD OF THE INVENTION

This invention relates to new and useful improvements in apparatus for detecting magnetically detectable plastic pipe and other sources of magnetic fields from a distance and to methods of using such apparatus.

BRIEF DESCRIPTION OF THE PRIOR ART

In many situations there is a need to locate pipes below the surface of the earth, either to service or repair them or to avoid inadvertent damage when subsequently excavating in the vicinity. Much of the pipe used in construction today, particularly for natural gas lines, is plastic rather than metal.

Plastic pipe is typically polyethylene, but may also be other formulations such as polyvinylchloride (PVC). Plastic pipe has several advantages. It is extremely inert, durable and reliable, relatively lightweight, easy to make, and cheaper than most other materials that may be used.

One problem in using plastic pipe, however, is that once buried it is difficult to find and service and more likely that unintentional damage will result from nearby digging.

Various attempts have been made to solve this problem. Ribbons have been buried above the pipes, so that one could in theory locate the pipe by digging until the ribbon, of a color contrasting to the soil, was found. See, e.g., Allen, U.S. Pat. No. 3,115,861, and Prosser, U.S. Pat. No. 3,282,057.

Similarly, metal foils have also been buried above pipes, as in Allen, U.S. Pat. No. 3,504,403, and Allen et al., U.S. Pat. No. 3,633,533. A variation on this theme is shown in Southworth et al., U.S. Pat. No. 3,568,626, which describes reinforcing a metal foil with some other material, such as nylon, fiberglass or steel, so that the foil is not easily broken.

Keene, U.S. Pat. No. 4,573,829 involves a somewhat similar concept, in which a wire is placed inside the pipe. The wire can be detected either by a magnetometer, if the wire is magnetic, or by applying an R.F. signal to the wire and locating it with an R.F. sensing device.

A number of patents have addressed the possibility of making magnetizable plastic pipe on similar products.

Japanese 60-82881 (Inventor Yasuo Ishii, assignee Taisei Kenetsu K.K.) discloses a synthetic resin underground pipe formed with a ferrite-blended resin and then magnetized so that it can be detected from the surface when buried in the ground.

Goodman U.S. Pat. No. 5,036,210 discloses a method of producing magnetically detectable plastic pipe for underground use comprising mixing particles of electrically-nonconductive, highly-magnetizable iron oxide or barium ferrite uniformly with organic plastic, heating and extruding the mixture to produce a hollow tubular pipe, and magnetizing the pipe, having said highly magnetized particles distributed and proportioned so that the plastic pipe may be easily detected by magnetic detection apparatus on the surface when the plastic pipe is buried at three to five feet or more under the ground.

Goodman U.S. Pat. No. 5,051,034 discloses a magnetically detectable plastic pipe for underground use hollow tubular plastic pipe having particles of electrically-nonconductive, highly-magnetized iron oxide or barium ferrite embedded in plastic and secured integrally with the wall of said pipe of a size, shape distribution and proportion such that the plastic pipe may be easily detected by magnetic detection apparatus on the surface when the plastic pipe is buried at three to five feet, more or less, under the ground. This disclosure mentioned only two magnetic materials, and it offered little specific information about how to encode magnetic information.

Rippingale et al U.S. Pat. Nos. 5,006,806 and 5,017,873 disclose a method and apparatus for locating, tracing, and identifying buried fiber optic cable, ducts, conduits and pipes by a rubber strip magnet (barium ferrite) magnetized across the width of the strip and wound helically on the fiber optic cable, tube, pipe or duct. The strip or stripe may be painted or coated on the object or may be extruded into or molded in the outer surface of the object and then magnetized. Another embodiment comprises a plurality of magnetic strip magnets oriented longitudinally of the object (hollow tube) or a plurality of magnetic strip magnets in short segments oriented longitudinally of the object (hollow tube).

Goodman U.S. patent application Ser. No. 831,160, filed Feb. 5, 1992 discloses a method of producing magnetically detectable plastic pipe for underground use, comprising mixing particles of electrically-nonconductive, highly-magnetizable iron oxide, barium ferrite or strontium ferrite uniformly with extrudable organic plastic and heating and extruding same to produce a hollow tubular plastic pipe. The pipe is then moved through a magnetizer to magnetize selected portions diametrically across the pipe so that the north pole is at one side of the pipe and the south pole is diametrically opposite it, whereby the pipe is readable from a distance.

Schonstedt U.S. Pat. No. 3,050,679 discloses a hollow tube type magnetic gradiometer with a pair of movably spaced sensor elements.

Schonstedt U.S. Pat. No. 3,736,502 discloses a multiple unit, flux-gate magnetic sensor apparatus.

Schonstedt U.S. Pat. No. 3,894,283 discloses a multiple unit, flux-gate magnetic sensor apparatus which produces a beat frequency whenever a magnetic object is located.

Schonstedt U.S. Pat. No. 3,909,704 discloses a multiple unit, flux-gate magnetic sensor apparatus with a two-piece sectional housing.

Schonstedt U.S. Pat. No. 3,961,245 discloses a multiple unit, flux-gate magnetic sensor apparatus comprising a bobbin and core construction.

Schonstedt U.S. Pat. No. 3,977,072 discloses a magnetic locator in which flux-gate sensors are mounted in notches or grooves at opposite ends of a supporting tube.

Howell U.S. Pat. No. 4,085,360 discloses a magnetic locator having sensors supported on tripod supporting arms.

Schonstedt U.S. Pat. No. 4,110,689 discloses a multiple unit, flux-gate magnetic sensor apparatus which produces a beat frequency when a magnetic object is located.

Schonstedt U.S. Pat. No. 4,388,592 discloses a multi-axis magnetometer with orthogonally disposed housings supporting separate sensor units.

Dunham U.S. Pat. No. 4,536,710 discloses a magnetic detector instrument with boardmounted sensor assembly.

Schonstedt U.S. Pat. No. 5,097,211 discloses a magnetic detection apparatus with plastic housing.

Rippingale U.S. Pat. No. 5,114,517 discloses a method of making a magnetic marker for plastic pipe.

Rippingale U.S. Pat. No. 5,122,750 (a division of U.S. Pat. No. 5,017,873) discloses a method of locating pipe marked magnetically.

These references do not specifically address the zeroing of the earth's magnetic field by subtraction of the signals received by the vertically spaced sensors or the sensing specifically of separate north and south poles of buried or remote magnetically detectable plastic pipe or other sources of magnetic fields, or the need for supporting a sensor in a vertical position at a distance from the operator of the apparatus or the use of an array of vertically positioned magnetic sensors supported on a wheeled structure moved over an surface to map the magnetic fields encountered.

SUMMARY OF THE INVENTION

One of the objects of this invention is to provide a new and improved magnetic sensor apparatus for detecting magnetically detectable plastic pipe or other sources of magnetic fields from a distance, e.g., from the surface when buried in the ground or in buildings or foundations, in storage, etc.

Another object of this invention is to provide a magnetic sensor apparatus for detecting magnetically detectable plastic pipe or other sources of magnetic fields from a distance, e.g., from the surface when buried in the ground or in buildings or foundations, in storage, etc. which detects the polarity of the magnetic field.

Another object of this invention is to provide a magnetic sensor apparatus for detecting magnetically detectable plastic pipe or other sources of magnetic fields from a distance, e.g., from the surface when buried in the ground or in buildings or foundations, in storage, etc. which detects the polarity of the magnetic field, the apparatus being supported in a vertical position at a substantial distance from the operator.

Another object of this invention is to provide a magnetic sensor apparatus for detecting magnetically detectable plastic pipe or other sources of magnetic fields from a distance, e.g., from the surface when buried in the ground or in buildings or foundations, in storage, etc. which comprises a tube with spaced sensor elements therein and supported by a handle for hand carrying which also supports a read out display of the magnetic field detected.

Another object of this invention is to provide a magnetic sensor apparatus for detecting magnetically detectable plastic pipe or other sources of magnetic fields from a distance, e.g., from the surface when buried in the ground or in buildings or foundations, in storage, etc. which comprises a tube with spaced sensor elements therein and supported by a handle for hand carrying which also supports a read out display of the magnetic field detected, the apparatus being supported by the handle in a vertical position at a substantial distance from the operator.

Another object of this invention is to provide a magnetic sensor apparatus for detecting magnetically detectable plastic pipe or other sources of magnetic fields from a distance, e.g., from the surface when buried in the ground or in buildings or foundations, in storage, etc. which comprises a plurality of sensor elements supported vertically in parallel on a wheeled supporting structure.

Another object of this invention is to provide a magnetic sensor apparatus for detecting magnetically detectable plastic pipe or other sources of magnetic fields from a distance, e.g., from the surface when buried in the ground or in buildings or foundations, in storage, etc. which comprises a plurality of sensor elements supported vertically in parallel on a hand-held support a substantial distance from the user or operator.

Another object of this invention is to provide a magnetic sensor apparatus for detecting magnetically detectable plastic pipe or other sources of magnetic fields from a distance, e.g., from the surface when buried in the ground or in buildings or foundations, in storage, etc. which detects the polarity of the magnetic field, when supported in a vertical position at a substantial distance from the operator.

Another object of this invention is to provide a magnetic sensor apparatus for detecting magnetically detectable plastic pipe or other sources of magnetic fields from a distance, e.g., from the surface when buried in the ground or in buildings or foundations, in storage, etc. by zeroing out the earth's magnetic field and detecting the polarity of the field being measured, when supported in a vertical position at a substantial distance from the operator.

Another object of this invention is to provide a magnetic sensor apparatus for detecting magnetically detectable plastic pipe or other sources of magnetic fields from a distance, e.g., from the surface when buried in the ground or in buildings or foundations, in storage, etc. having spaced magnetic field sensors with a subtraction circuit connected to eliminate the earth's magnetic field, whereby the sensors detect the polarity of the field being measured when supported in a vertical position at a substantial distance from the operator.

Another object of this invention is to provide a magnetic sensor apparatus for detecting magnetically detectable plastic pipe or other sources of magnetic fields from a distance, e.g., from the surface when buried in the ground or in buildings or foundations, in storage, etc. and measuring the distance of the magnetic field source.

Another object is to provide a new and improved method for detecting magnetically detectable plastic pipe or other sources of magnetic fields from a distance, e.g., from the surface when buried in the ground or in buildings or foundations, in storage, etc. and for measuring the distance of the magnetic field source.

Another object of this invention is to provide a new and improved method for detecting magnetically detectable plastic pipe or other sources of magnetic fields from a distance, e.g., from the surface when buried in the ground or in buildings or foundations, in storage, etc. which comprises supporting a tube with spaced sensor elements therein by a handle which also supports a read out display of the magnetic field detected, in a vertical position at a substantial distance from the operator and moving the vertically oriented tube over the surface or region to be inspected.

Other objects of the invention will become apparent from time to time throughout the specification and claims as hereinafter related.

The invention comprises a novel magnetic field detector apparatus and methods of using the apparatus to sense specialized magnetic field signatures. This apparatus and associated methods allows plastic pipe, containing magnetized particles, to be located and various characteristic information regarding the pipe to be obtained from pipe buried a substantial distance below ground. In addition to locating buried, magnetized, plastic pipe, the apparatus and associated methods can detect (a) the type of pipe, (b) the diameter of the pipe, (c) how deeply the pipe is buried, and (d) specialized information magnetically encoded into the pipe.

DESCRIPTION OF THE PREFERRED EMBODIMENTS HAND-HELD MAGNETIC DETECTOR

This invention relates to magnetic detection apparatus for detecting magnetically detectable plastic pipe or other sources of magnetic fields from a distance, e.g., from the surface when buried in the ground or in buildings or foundations, in storage, etc. and measuring the distance of the magnetic field source.

Figure 2:
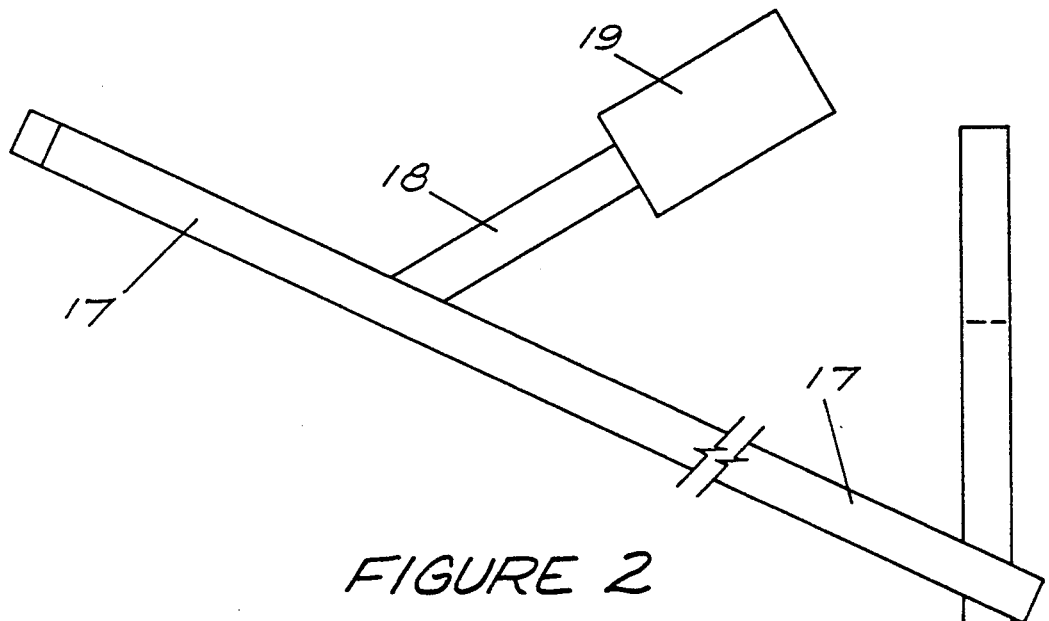
FIG. 2 is a view in elevation of a hand-held magnetic detection apparatus using the magnetic sensor tube shown in FIG. 1.
Figure 1:
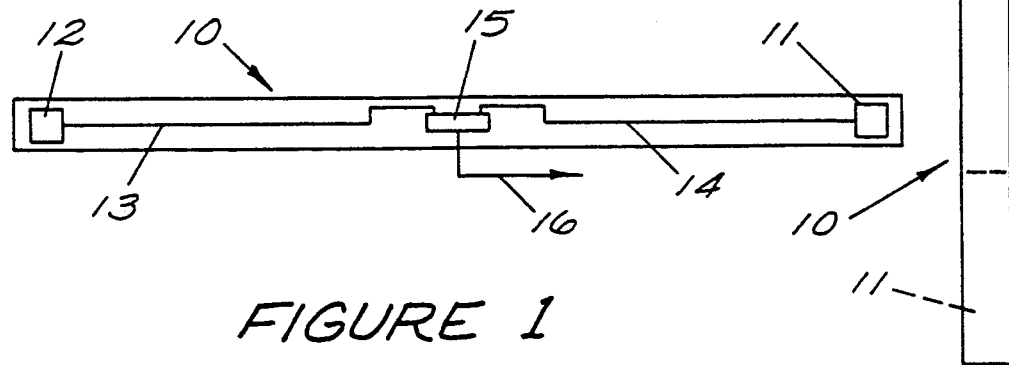
FIG. 1 is a plan view of a magnetic sensor tube used in the magnetic detection apparatus of this invention.
Figure 6:
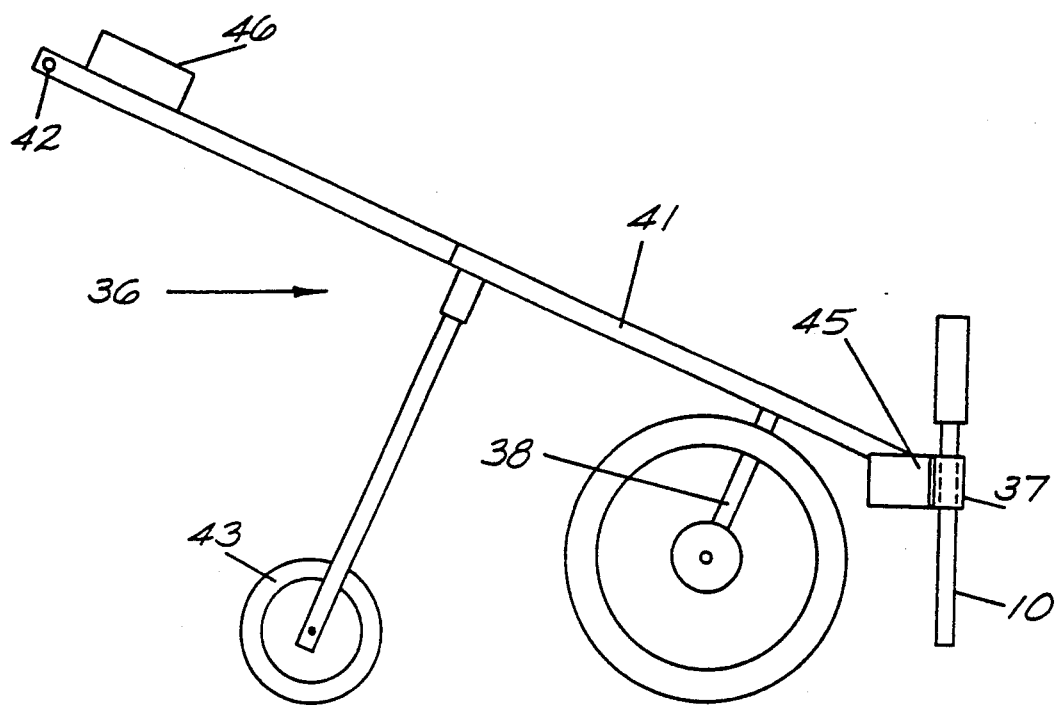
FIG. 6 is a view in side elevation of the magnetic mapping apparatus shown in FIG. 5.
Figure 5:
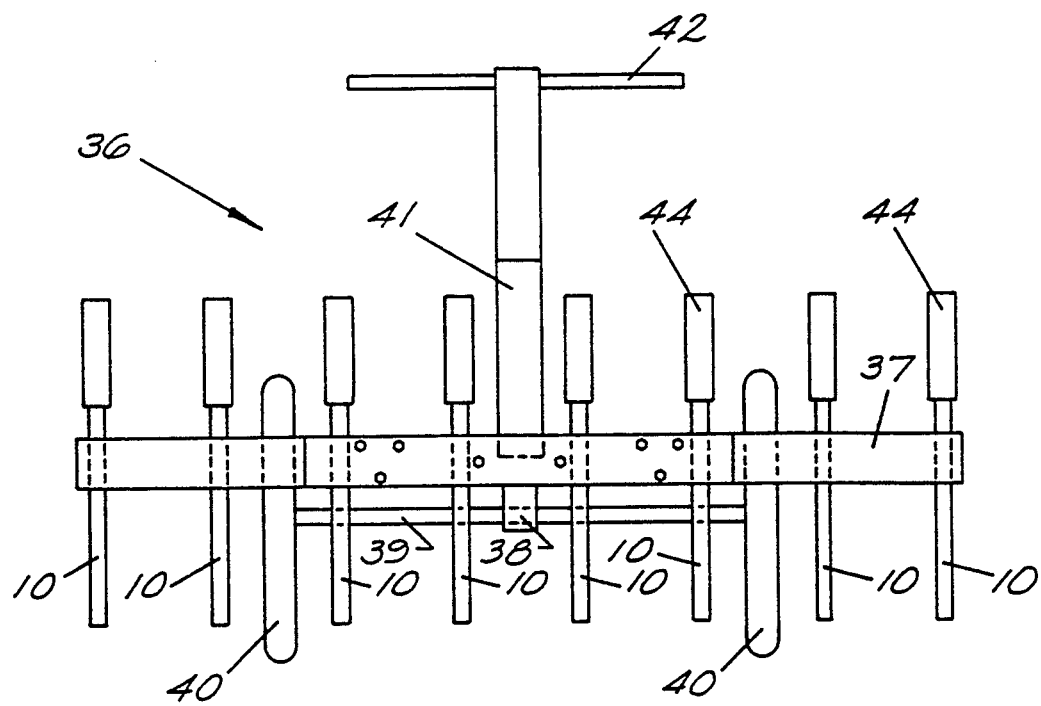
FIG. 5 is a plan view of a magnetic mapping apparatus comprising a parallel array of the sensor tubes shown in FIG. 1 mounted on a wheeled support.

In FIG. 1, there is shown a detector tube or magnetic field gradiometer 10 which is used in the hand-held apparatus of FIG. 2 and the mapping apparatus of FIGS. 5 and 6. Detector tube 10 or gradiometer is a hollow non-magnetic (aluminum) tube with sensors 11 and 12 mounted inside opposite ends thereof. Detector tube 10 is supported at the distal end of a hollow (non-magnetic) supporting tube 17 having a handle 18 extending at an acute angle therefrom. A display box or read-out module 19 for read out and measurement is supported on handle 18. Batteries for operating the apparatus are carried in the upper end of tube 17. The size and weight of sensor tube 10, supporting tube 17, handle 18 and display box 19 are the angles at which they are assembled assure that when the apparatus is hand held by handle 18 supporting tube is balanced in a vertical position at a substantial distance ahead of the operator.

Figure 3:
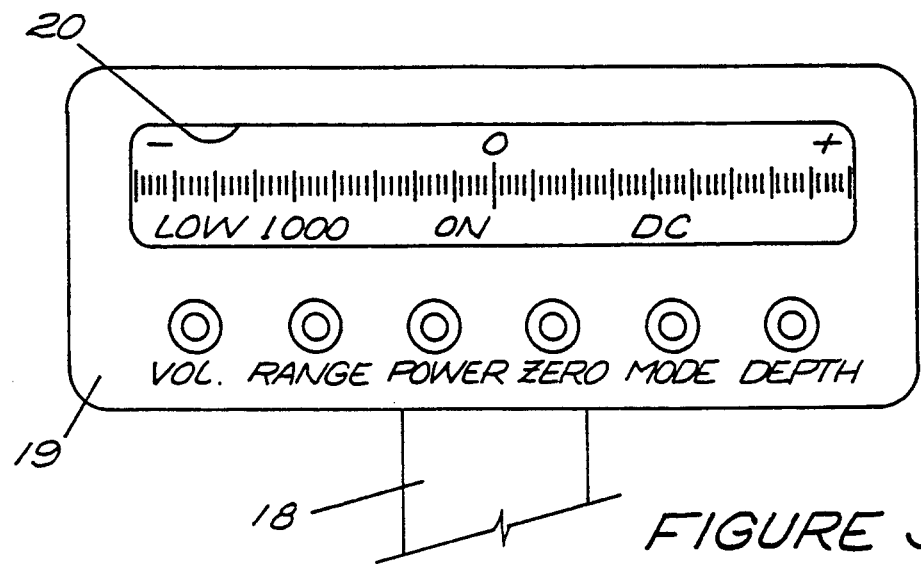
FIG. 3 is a plan view of the read-out display module of the hand-held magnetic detection apparatus shown in FIG. 1.

A detail elevation of read-out module 19 is shown in FIG. 3. Read-out module 19 has a built-in speaker (not shown) and an open display panel 20 and push button switched for volume, range, power (on/off), zero (for zeroing the instrument in a magnetically neutral environment), mode and depth along the lower edge portion of the module.

Sensors 11 and 12 each consists of two fluxgate magnetometers (probes) which are separated vertically by approximately 12". Each magnetometer measures the strength of the vertical component of the magnetic field. Sensors 11 and 12 are connected by leads 13 and 14 to a differential amplifier 15 having an output lead 16 connected to a display device. Differential amplifier 15 subtracts the signals from sensors 11 and 12 to give the vertical gradient of the magnetic field. The device is known in the literature as a magnetic gradiometer.

In the absence of a magnetized object, the subtraction zeroes out the earth's magnetic field and the vertical gradient is zero. When the gradiometer 10 is positioned near a magnetized object, the lower sensor 11 measures an appreciably larger field than the upper sensor 12 sensing a magnetic field gradient which is a measure of the intensity of the field (a function of the strength of the magnetized object and its distance). A digital circuit processes the net signal, after subtraction, to determine strength and polarity of the field and display the output to the user.

Figure 4:
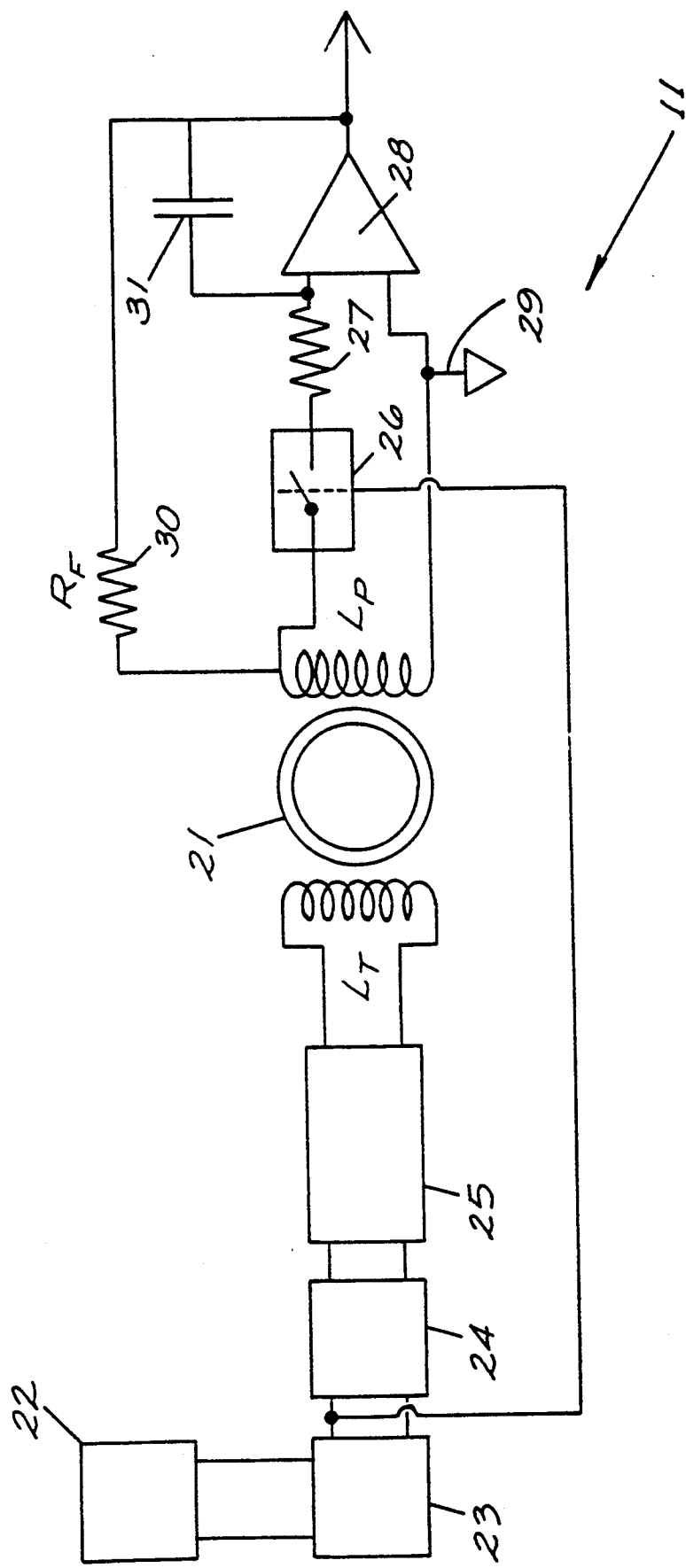
FIG. 4 is a block diagram one of the flux-gate probe elements from the magnetic sensor tube shown in FIG. 1.
Figure 7:
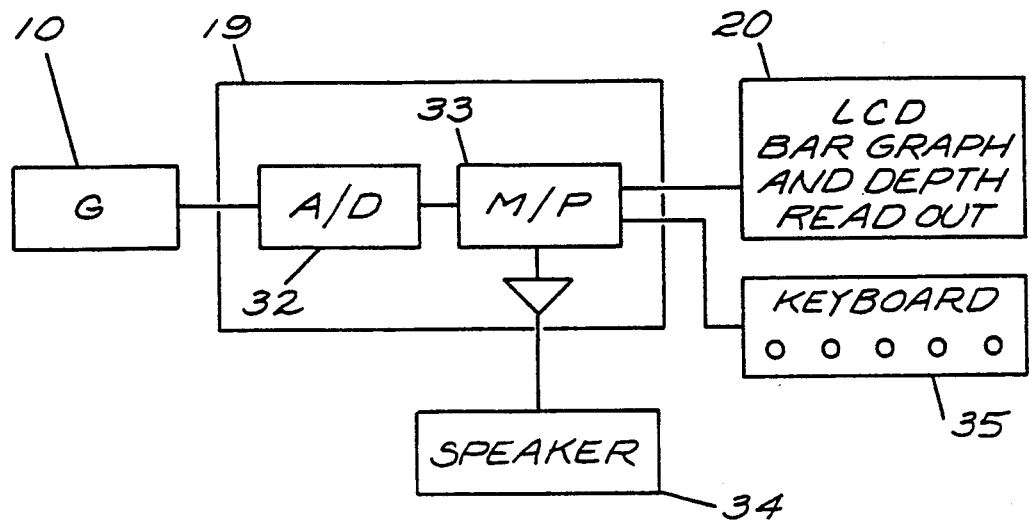
FIG. 7 is a block diagram of the sensor and read-out display module of the apparatus shown in FIGS. 1-3.
Figure 8:
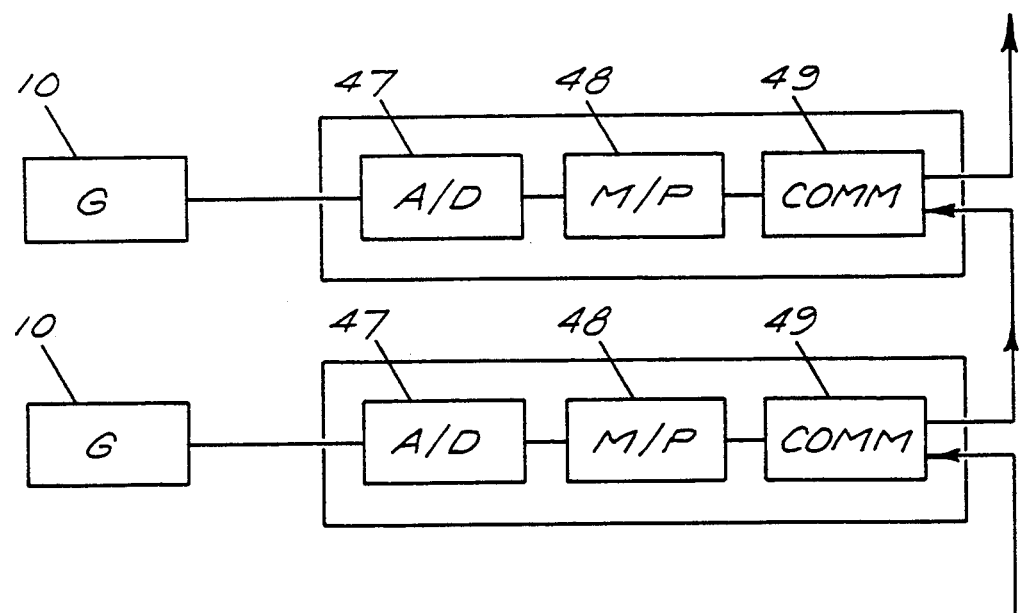
FIG. 8 is a block diagram of the sensors and read-out of the apparatus shown in FIGS. 5-6.

A block diagram of one of the fluxgate probes which makes up the sensor is shown in FIG. 4 and a block diagram of the connection of the gradiometer 10 to display box 19 is shown in FIG. 7.

Probe 11 (or 12) has a magnetic sensing element comprising a toroidal ring 21 of supermalloy (a very high permeability material used in instruments). Ring 21 is wrapped with an excitation or drive coil $L_t$ which periodically saturates the coil at a frequency of about 25 KHz. The core 21 is easy to saturate because of its high permeability and reaches saturation with application of a field of about 0.05 Oe. Ring 21 is also wrapped with a pick-up coil $L_p$ extending completely around the toriod which is used to sense the presence of an external field.

A 100 KHz oscillator 22 drives a frequency divider 23 (divide by 2) which supplies a 50 KHz output to a second frequency divider 24 (divide by 2). The 25 KHz output from divider 24 is supplied to power driver 25 which supplies 25 KHz power to drive coil $L_t$. Pick-up coil $L_p$ is connected on one side through a synchronous switch 26 and resistor 27 to an integrator 28. The other side of pick-up coil $L_p$ is connected to ground 29 and to the output of the integrator through resistor 30. Capacitor and resistor R27 together set the time constant of the integrator 28.

When the sensor 11 (or 12) is placed in an external magnetic field with the axis of coil 21 parallel to the orientation of the field, the toroid constitutes a low reluctance path and the external field bends to go through both legs of the toroid so long as it is not saturated. Once saturated, the toroid reluctance is no longer low and the field does not bend to go through it.

When the toroid is periodically saturated by winding $L_t$, the external field is periodically sucked into and then expelled from the toroid. This creates a parametric up converter wherein a low frequency external magnetic field variation is up converted to sidebands around the second harmonic of the toroid drive frequency.

The magnetic field moving in and out of the toroid creates a voltage in the pick-up coil $L_p$. Since the field collapses and reenters the toroid in an identical manner when the toroidal drive coil 25 saturates in either the plus or minus direction, the pick-up voltage is proportional to the external field amplitude but at the second harmonic of the toroidal drive frequency.

As seen above, oscillator 22 drives driver 25 through dividers (divide by 2) 24 and 25. Divider 24 eliminates even harmonics from the drive oscillator 22. Divider 25 produces an output frequency which is one half the frequency of the second harmonic reference voltage necessary for synchronous detection of pick-up coil voltage. The synchronous detection circuitry comprises a switch which is turned on and off at the second harmonic frequency. This in effect multiplies a second harmonic square wave with the incoming pick-up signal and produces a difference frequency component (low frequency $\approx$ dc) and a sum frequency component signal is represented by the difference component. The integrator filters out the sum frequency component.

In FIG. 7, gradiometer (G) 10 has its output signal connected to read-out module 19. The circuit board for converting the signals from gradiometer 10 to visual or audible output or to distance measurement is located inside read-out module 19. The connection from gradiometer 10 is to an A/D converter 32 which converts the fluctuating signal to a digital output that can be processed by microprocessor 33. The microprocessor produces a signal that drives the speaker and LCD readout bar graph.

WHEELED MAGNETIC FIELD MAPPER

FIGS. 4-8 show the use of a plurality of the gradiometers 10 in a magnetic field mapping apparatus 36. In field mapper 36, a supporting bar 37 supports an array of gradiometers 10 in parallel relation. Supporting bar 37 is supported on one end of a bar 38 having its other end connected to axle 39 for a pair of wheels 40. A bar 41 extends from supporting bar 37 to a handle 42 at its upper end. A third wheel 43 is optionally supported on bar 41 to provide a tripod support.

Figure 9:
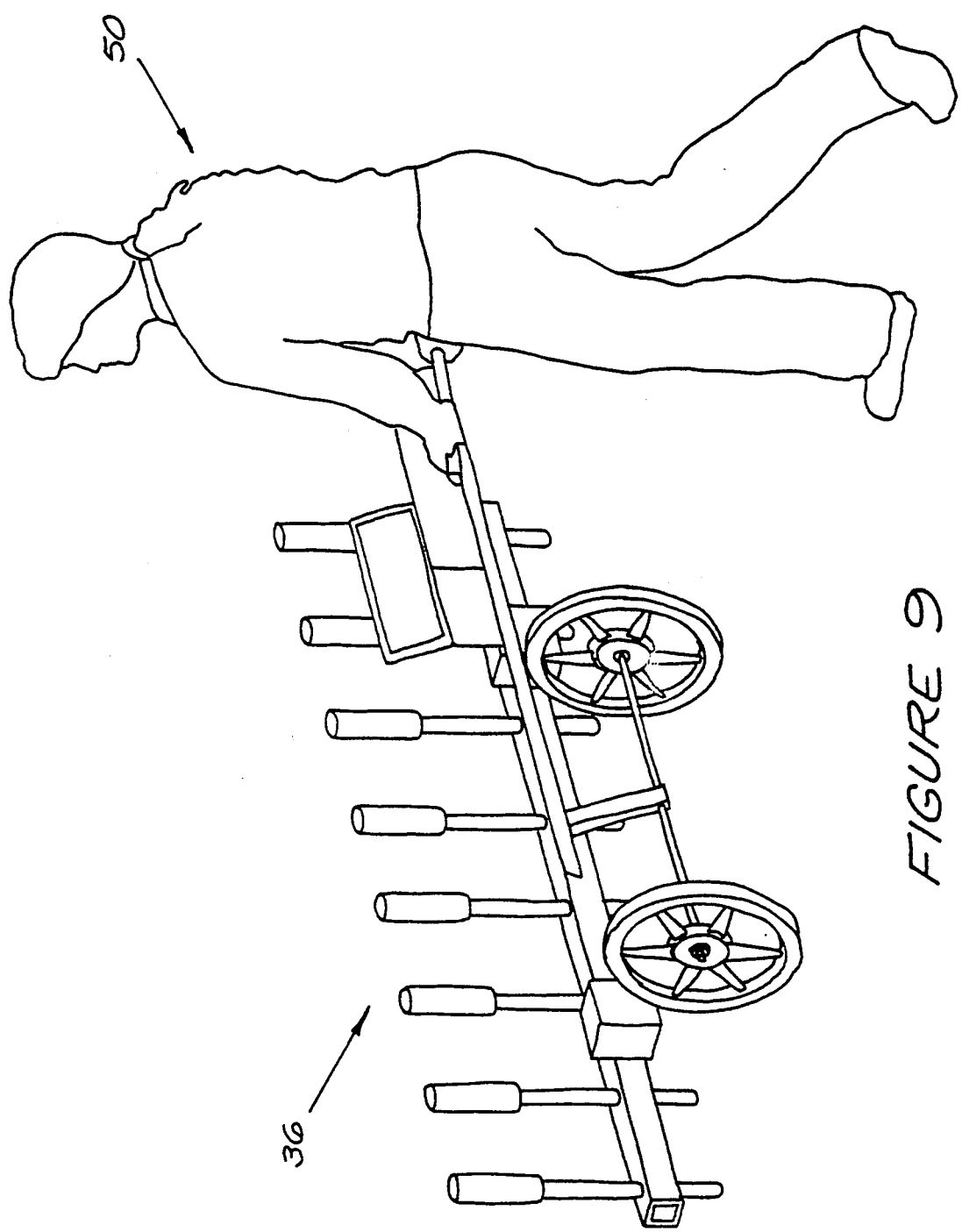
FIG. 9 is a perspective view of an operator using the apparatus shown in FIGS. 5-6.

In the tricycle version, the three wheels cause the gradiometer tubes 10 to be supported vertically. In the two-wheeled version, the operator is expected to hold the gradiometer tubes 10 vertical by visual estimate of their position. In the mapper, the gradiometer tubes 10 are enlarged at their upper ends 44 which are split and open to install and access the circuit boards for each gradiometer. Batteries 45 power the mapper 36 and the signals from the individual gradiometers are fed to a laptop or notebook size personal computer 46. The perspective view in FIG. 9 shows mapper 36 being wheeled along the ground by operator 50. The wheels 40 and 43 also provide for measuring the distance traveled by the apparatus to permit developing a contour map of field intensity versus distance traveled.

A block diagram of the circuit for the mapper is shown in FIG. 9. Each of the gradiometers (G) 10 has its output signal connected to circuit boards in the enlarged upper ends of tubes 10 for converting the signals from gradiometer 10 to visual or audible output or to distance measurement. The connection from each gradiometer 10 is to an A/D converter 47 which converts the fluctuating signal to spaced counts. The output from A/D converter 47 is fed to microprocessor 48 and thence to the serial port of computer 46 having a speaker for audible signal, LCD, or the like, yielding a visual read-out and depth read-out. The keyboard of computer 46 supplies the required commands for the display desired.

HAND-HELD MAGNETIC FIELD MAPPER

Figure 10:
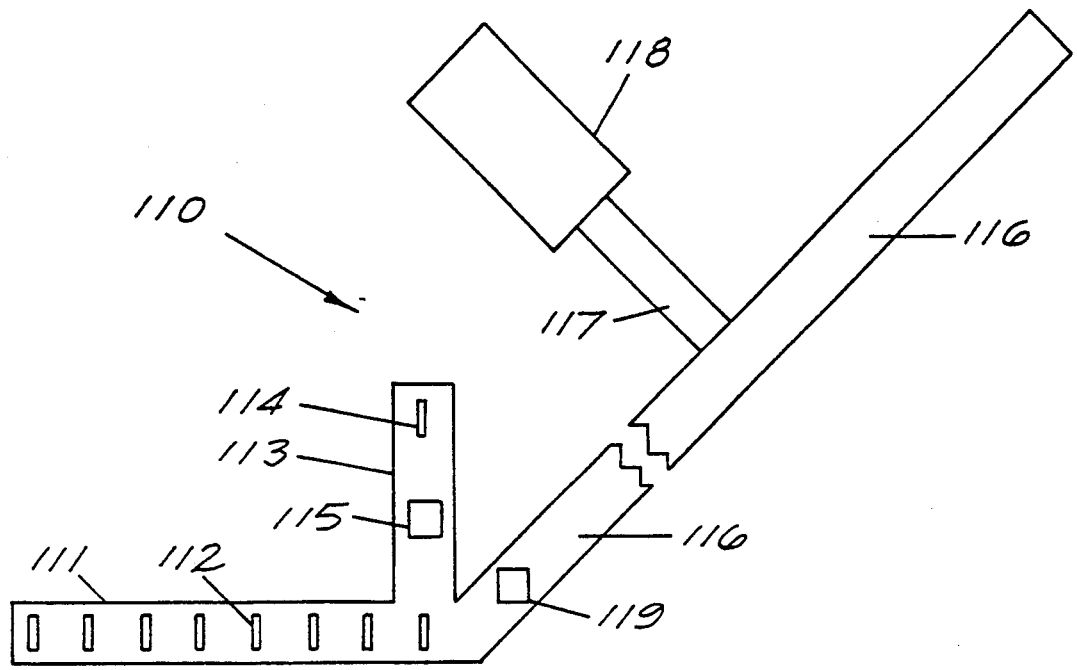
FIG. 10 is a view in side elevation of a magnetic mapping apparatus comprising a parallel array of flux-gate sensors on a hand-held support.
Figure 11:
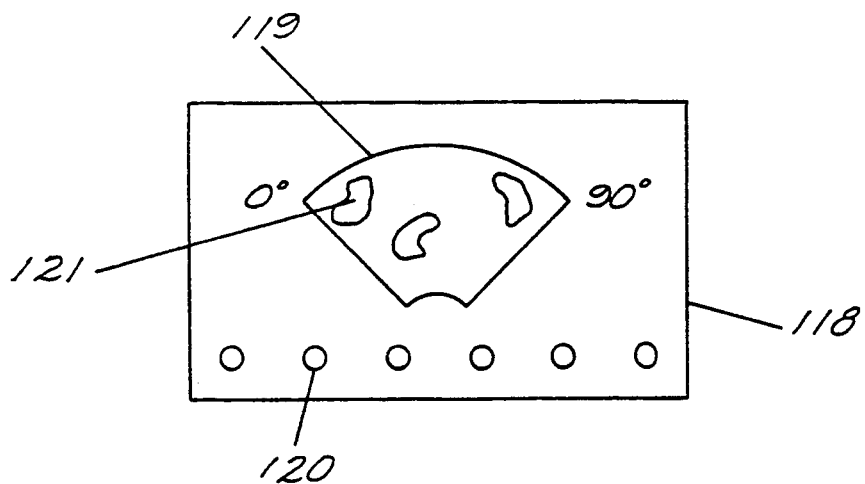
FIG. 11 is a plan view of the read-out display module of the hand-held magnetic mapping apparatus shown in FIG. 10.
Figure 12:
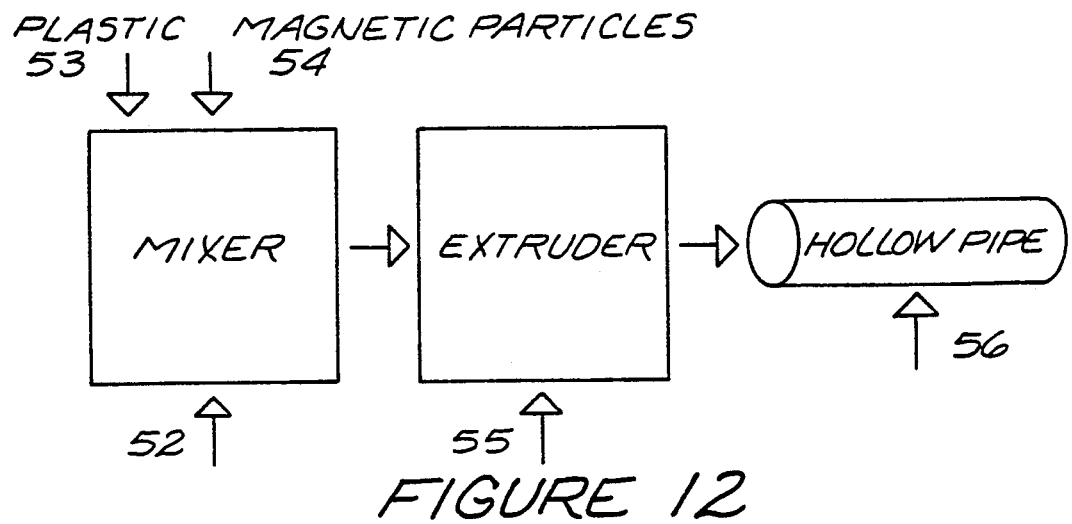
FIG. 12 is a flow diagram of the extrusion or coextrusion of plastic pipe containing particles of magnetic material to produce a pipe which is magnetized and subsequently detected by the apparatus of this invention.

FIGS. 10-11 show a hand-held magnetic field mapping apparatus 110. In field mapper 110, a supporting tube 111 supports an array of flux-gate sensors 112 in parallel relation. Supporting tube 111 has a vertically extending tube 113 which supports a single reference flux-gate sensor 114 and a flux-gate compass 115. Tubes 111 and 113 are supported on the end of a support tube 116 which has a handle 117 extending at an angle therefrom. A read-out or display module 118 is supported on handle 118. Reference sensor 114 functions to zero out the earth's magnetic field by sending the respective signals through differential amplifiers 119 (one for each sensor 112) through a microprocessor to read-out module 118. The read-out module 118 has a LCD display 119 and a plurality of buttons (switches) 120 which function similarly to the device shown in FIG. 3. Flux-gate compass 115 functions to show the angle of movement of the mapper on display module 118 and the readout patterns 121, based on the signals from the microprocessor, show the variation of the magnetic field sensed as the mapper is swept from side to side.

PRODUCTION OF MAGNETIC PLASTIC PIPE AND USE OF DETECTOR OR MAPPER IN LOCATING SAME

Goodman U.S. Pat. No. 5,036,210 discloses a method of producing magnetically detectable plastic pipe for underground use comprising mixing particles of electrically-nonconductive, highly-magnetizable iron oxide or barium ferrite uniformly with organic plastic, heating and extruding the mixture to produce a hollow tubular pipe having said highly magnetized particles distributed and proportioned so that the plastic pipe may be easily detected by magnetic detection apparatus on the surface when the plastic pipe is buried at three to five feet or more under the ground.

Goodman U.S. Pat. No. 5,051,034 discloses a magnetically detectable plastic pipe for underground use hollow tubular plastic pipe having particles of electrically-nonconductive, highly-magnetized iron oxide or barium ferrite embedded in plastic and secured integrally with the wall of said pipe of a size, shape, distribution and proportion such that the plastic pipe may be easily detected by magnetic detection apparatus on the surface when the plastic pipe is buried at three to five feet, more or less, under the ground. This disclosure mentioned only two magnetic materials, and it offered little specific information about how to encode magnetic information.

In the Goodman patents, the extruded plastic pipe with embedded magnetic particles is not magnetic unless the individual magnetic particles are partially or completely aligned. When the pipe is extruded, the magnetic particles are randomly oriented and cancel each other out. The pipe, as produced, is therefore not magnetic and would not be detectable from the surface when it is buried. Application of a magnetic field will magnetize the particles within the plastic pipe in the direction of the field and the magnetism is permanent, remaining after the field is removed. The result is a signature that can be read from a distance.

In Goodman U.S. patent application Ser. No. 831,160, filed Feb. 5, 1992, applicant discloses a method of producing magnetically detectable plastic pipe for underground use, comprising mixing particles of electrically-nonconductive, highly-magnetizable iron oxide, barium ferrite or strontium ferrite uniformly with extrudable organic plastic and heating and extruding same to produce a hollow tubular plastic pipe. The pipe is then moved through a magnetizer to magnetize selected portions diametrically across the pipe so that the north pole is at one side of the pipe and the south pole is diametrically opposite it, whereby the pipe is readable from a distance. A portion of the specification of the Goodman patent application is repeated below to provide a setting for describing the use of the magnetic field detectors embodying this invention.

GOODMAN METHOD OF PRODUCING AND MAGNETIZING MAGNETICALLY DETECTABLE PLASTIC PIPE

A magnetically detectable plastic pipe for underground use consists of a hollow tubular plastic pipe having particles of magnetic material embedded and secured integrally within the wall of the pipe. The magnetic material consists of electrically nonconductive, highly magnetizable particles of a shape, size, distribution, and proportion such that the plastic pipe may be detected from a distance by the magnetic detection apparatus described above when the plastic pipe is buried at a selected depth, e.g., three to five feet, more or less, under the ground. The particles may be strontium ferrite, barium ferrite, iron oxide or other highly magnetizable materials.

FIG. 10 shows a schematic block diagram of an apparatus and method for extruding pipe. A conventional plastics extrusion mixer 52 receives a supply of extrudable plastic 53, usually powder or pellets, and a supply of magnetic particles 54. The plastic 53 may be polyethylene, polyvinyl, or other moldable or extrudable organic resin polymers. The magnetic particles may be strontium ferrite, barium ferrite, iron oxide, or any other highly magnetizable material, i.e., a material which will magnetize readily and remain magnetized for a very long time.

Sometimes magnetic particles and plastic powder are premixed and made into pellets (a process called compounding) before being fed to an extruder to make pipe. This enables a more uniform mixing of the magnetic particles and plastic material than occurs in the hopper of an extruder. Prepelletizing is especially important because typical magnetic particles are more massive than plastic and tend to settle in the extruder hopper resulting in an uneven distribution of magnetic particles in the pipe.

The mixture of molten plastic 53 and magnetic particles 54 flows from the mixer 52 to a plastics extruder 55, where it is extruded into a hollow tubular pipe 56. The distribution of the magnetic particles within the plastic pipe is determined by the type of extrusion die used. One conventional type of extrusion die will mix the magnetic particles uniformly throughout the wall of the pipe.

FIG. 11 shows a lateral cross section of pipe 56 produced by such a process, with magnetic particles 54 uniformly distributed throughout the wall of the pipe. FIG. 3 shows a longitudinal section of the same pipe 56 and its uniformly dispersed magnetic particles 54.

Another conventional type of extrusion die will produce a composite structure consisting of an inner layer which may consist of plastic without magnetic particles, and an outer layer which may consist of plastic mixed with magnetic particles. A conventional extrusion die with separate extrusion nozzles for each layer will accomplish this result.

The method of mixing of plastics and magnetizable particles as described above is that generally described in Goodman U.S. Pat. Nos. 5,051,034 and 5,036,210 and illustrates that strontium ferrite is equally as suitable for those embodiments and methods as the barium ferrite and iron oxide previously described.

METHODS OF MAGNETIZING THE PIPES

In the application of the magnetic sensor of FIGS. 1, 2, 5 and 6, to searching for buried pipe, the maximum magnetic signature is obtained from a magnetization of the individual particles perpendicular to the wall of the pipe (rather than along the length of the pipe), so that when the pipe is buried, the magnetic poles point straight up at the detector apparatus for ease of reading when the detector apparatus is passed over the surface of the ground.

The particles of iron oxide, barium ferrite, or strontium ferrite or other suitable materials are not magnetic at the time of starting fabrication of the pipe. Each particle contains a single magnetic domain. The assembly of particles is randomly oriented, therefore the pipe containing the particles is not magnetic and has no macroscopic magnetic signature.

Figure 13:
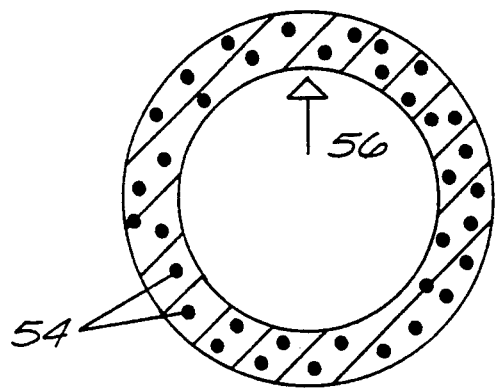
FIG. 13 is a lateral cross section of an extruded plastic pipe containing uniformly dispersed particles of magnetic material, produced in accordance with FIG. 12.

FIG. 13 shows a plastic pipe 56 in which the magnetic moments of the particles 54 are randomly oriented and the pipe 56 has not been magnetized. In this figure, the magnetic moments of the particles 54 are represented by arrows. Each arrow points in the preferred direction of magnetization for that magnetic particle 54. Since the magnetic particles 54 have not yet been magnetized, the pipe 56 has virtually no magnetic signature, and it is not detectable from a distance, e.g., from the surface in the case of buried pipe by any conventional means.

To create a magnetically detectable pipe, it is necessary to magnetize the particles by applying a magnetic field. The applied magnetic field will orient the magnetic domains of the particles to produce permanent magnetic portions in the pipe.

Figure 14:
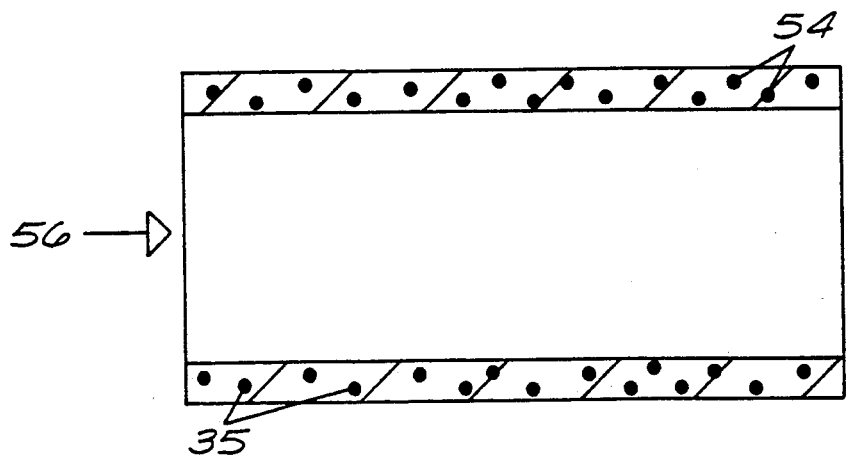
FIG. 14 is a longitudinal cross section of an extruded plastic pipe containing uniformly dispersed particles of magnetic material, produced in accordance with FIG. 12.

FIG. 14 shows a flow diagram including the steps of FIG. 10 and additionally including a magnetizer 57 for magnetizing the pipe 56. The magnetizer 57 may be a solenoid or a permanent magnet as needed. The magnet may be designed to apply a constant magnetic field or it may apply a magnetic field in the form of a short pulse.

It is important to realize that the magnetic particles 54 have a preferred direction of magnetization, which depends partly on their shape. The iron oxide particles used are shaped like needles. The barium ferrite particles used are disk-shaped platelets. For example, the preferred direction of magnetization of needle-shaped iron oxide particles is along the length of the needle. Iron oxide particles gain the strongest magnetization when they are "pointing" in a direction parallel to the applied magnetic field.

The greater their angle of misorientation with the applied magnetic field, the less they can be magnetized. Iron oxide particles pointing at right angles to the applied magnetic field do not become magnetized at all. Barium ferrite platelets, however, are preferably magnetized across the platelets.

MAGNETIZING THE PIPE AFTER IT SOLIDIFIES

For ease of handling the pipe, it may be desirable to magnetize the pipe after it solidifies. When the pipe solidifies, the magnetic particles become frozen in their randomly oriented physical positions. When a magnetic field is applied to magnetize the particles, those particles whose preferred direction of magnetization happens to be parallel to the applied magnetic field will become strongly magnetized.

At the other extreme, the particles whose preferred direction of magnetization happens to be perpendicular to the applied to the magnetic field will not magnetized at all, and thus will make no contribution to the magnetization of the pipe. Particles with intermediate orientations that is, those whose preferred direction of magnetization is at an angle equal to or greater than 0° and equal to or less than 90° to the direction of the applied magnetic field will make some contribution which. however, diminishes as the angle increases toward 90°.

Figure 15:
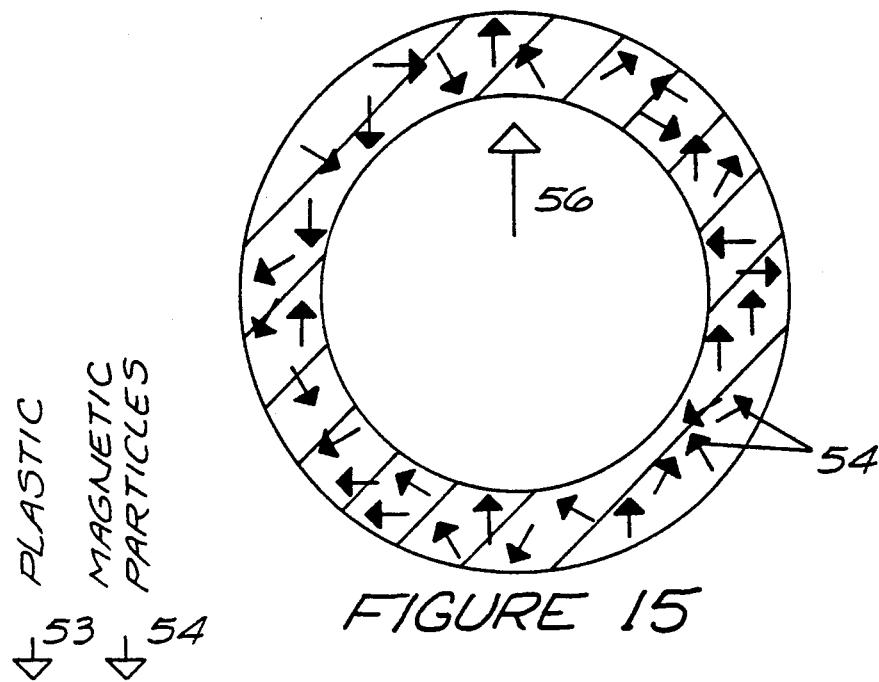
FIG. 15 is a lateral cross section of an extruded non-magnetized plastic pipe containing randomly oriented particles of uniformly dispersed magnetic material.

FIG. 15 shows a pipe 56 which was magnetized after it solidified. Again, the magnetic particles 54 are represented by arrows. In this case, however, the symbolism of the arrows is different: all the arrows point in the direction of the magnetization of the pipe, regardless of the physical orientation of the particles they represent. The size of the arrows varies to reflect the fact that different magnetic particles 54 make different contributions to the magnetization of the pipe, depending on their orientation.

Magnetic particles 54 oriented with their preferred direction of magnetization parallel to the direction of magnetization of the pipe make the largest contributions and therefore have the largest arrows. However, magnetic particles 54 oriented so that their preferred direction of magnetization is at some angle with the direction of magnetization of the pipe have smaller arrows. Magnetic particles with their preferred direction of magnetization at right angles make no contribution whatever to the magnetization of the pipe and are therefore not shown at all.

MAGNETIZING THE PIPE BEFORE IT SOLIDIFIES

Another method is to magnetize the pipe during extrusion, or soon after extrusion before the pipe solidifies. Under these circumstances, the applied magnetic field will not only magnetize the particles, it will also cause them to change their physical orientation, i.e., to align themselves so that their preferred direction of magnetization is parallel to the applied magnetic field just as iron filings align themselves parallel to the field of a bar magnet. As a result, each magnetic particle will give a maximum contribution to the magnetization of the pipe, and the magnetization of the pipe will be maximized. While magnetization of the particles while the plastic is still fluid or plastic facilitates realignment of the magnetic particles, it makes the handling of the pipe more difficult at this time and there is a somewhat lower permanent magnetism achieved (due to possibly exceeding the Curie point of the material).

Figure 16:
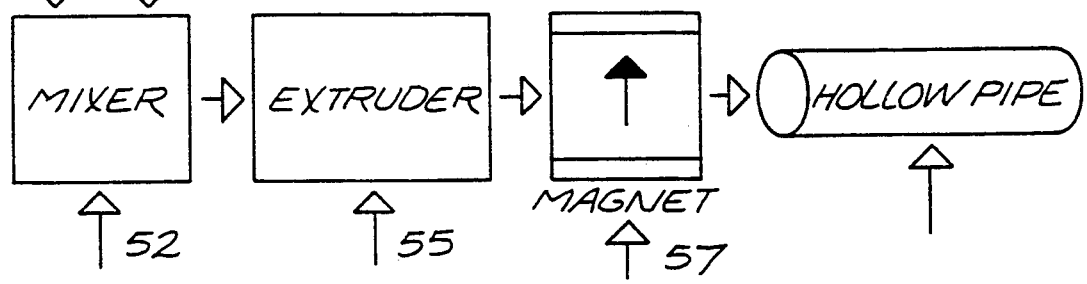
FIG. 16 is a flow diagram of the extrusion or coextrusion of plastic pipe containing particles of magnetic material, which also shows the magnet required to magnetize the particles.

FIG. 16 shows a pipe 56 which was magnetized before it solidified. As in FIG. 15, the magnetic particles 54 are represented by arrows, and the size of the arrow corresponds to its contribution to the magnetization of the pipe. In this case, since all the particles are physically aligned in the most desirable orientation, the arrows are uniformly large. The magnetization of the pipe 56 may be maximized. Such a strongly magnetized pipe 56 is, of course, relatively easy to detect from above the ground.

FIG. 16 shows an ideal case in which all the magnetic particles have the most desirable physical alignment. In practice, the limits to which one can approach this ideal case depends on factors such as the viscosity of the plastic, the strength of the magnetic field and the Curie point of the magnetic particles.

If the magnetic signature of the pipe were distinctive in some way, different types of pipe could be distinguished from one another and from other magnetic objects buried in the ground. Unique pipe signatures can be created by varying the magnetism along the length of the pipe, as by changing the intensity and/or direction of the magnetism. Thus, a gas pipe can be distinguished from cast iron or steel pipe or rebar, as described below.

PIPES ENCODED WITH MAGNETIC INFORMATION AND METHODS OF FABRICATING THEM WHERE THE DIRECTION OF THE FIELD IS REVERSED PERIODICALLY

Figure 17:
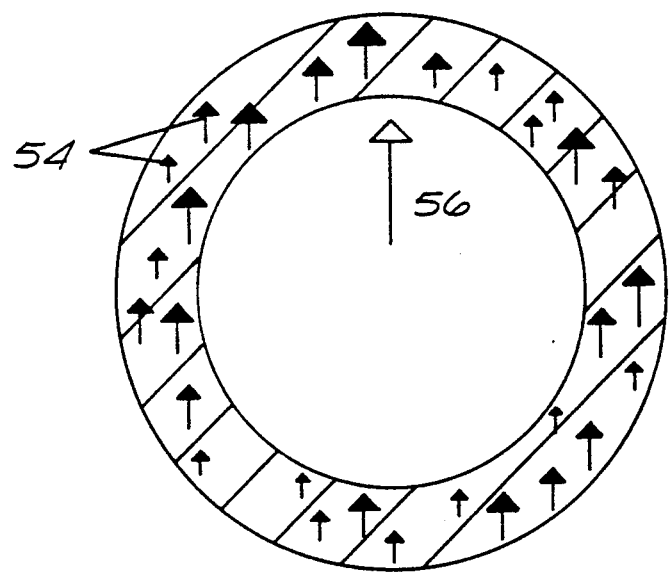
FIG. 17 is a lateral cross section of an extruded magnetized plastic pipe containing particles of magnetic material which make different contributions to the magnetization of the pipe, depending on their magnetic orientation.

A particularly distinctive signature can be created in the pipe by reversing the direction of magnetization of the magnetic particles at regular intervals along the length of the pipe. FIG. 17 shows a plastic pipe 56 which contains regions 58, 59 in which the magnetic particles 54 are oriented with their magnetization pointing from right to left, and regions 60, 61 in which the magnetic particles 54 are oriented with the magnetization pointing from left to right. This system is useful because it provides a way to distinguish magnetically detectable plastic pipes from iron pipes.

A suitable magnetic sensor, as described above, located above the ground can indicate the reversal of direction of the magnetic field. The relative lengths of the regions 58, 59, 60, 61 can convey information such as the diameter or depth of the pipe.

Such a pipe can be made by the method shown in the flow diagram shown in FIG. 14, provided that the magnetizer 57 can reverse the direction of the magnetic field at regular intervals along the length of the extruded pipe.

Figure 18:
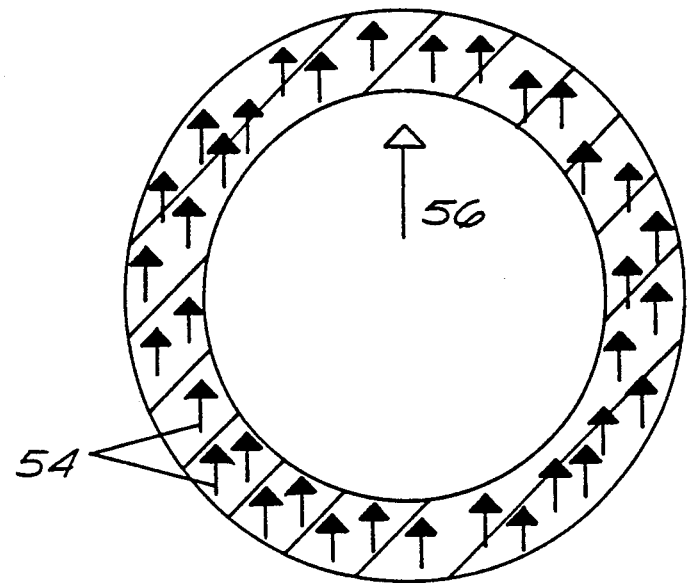
FIG. 18 is a lateral cross section of an extruded magnetized plastic pipe containing particles of magnetic material, all of which make strong contributions to the magnetization of the pipe because they have been mechanically oriented so that their preferred direction of magnetization is parallel to the direction of magnetization of the pipe.
Figure 19:
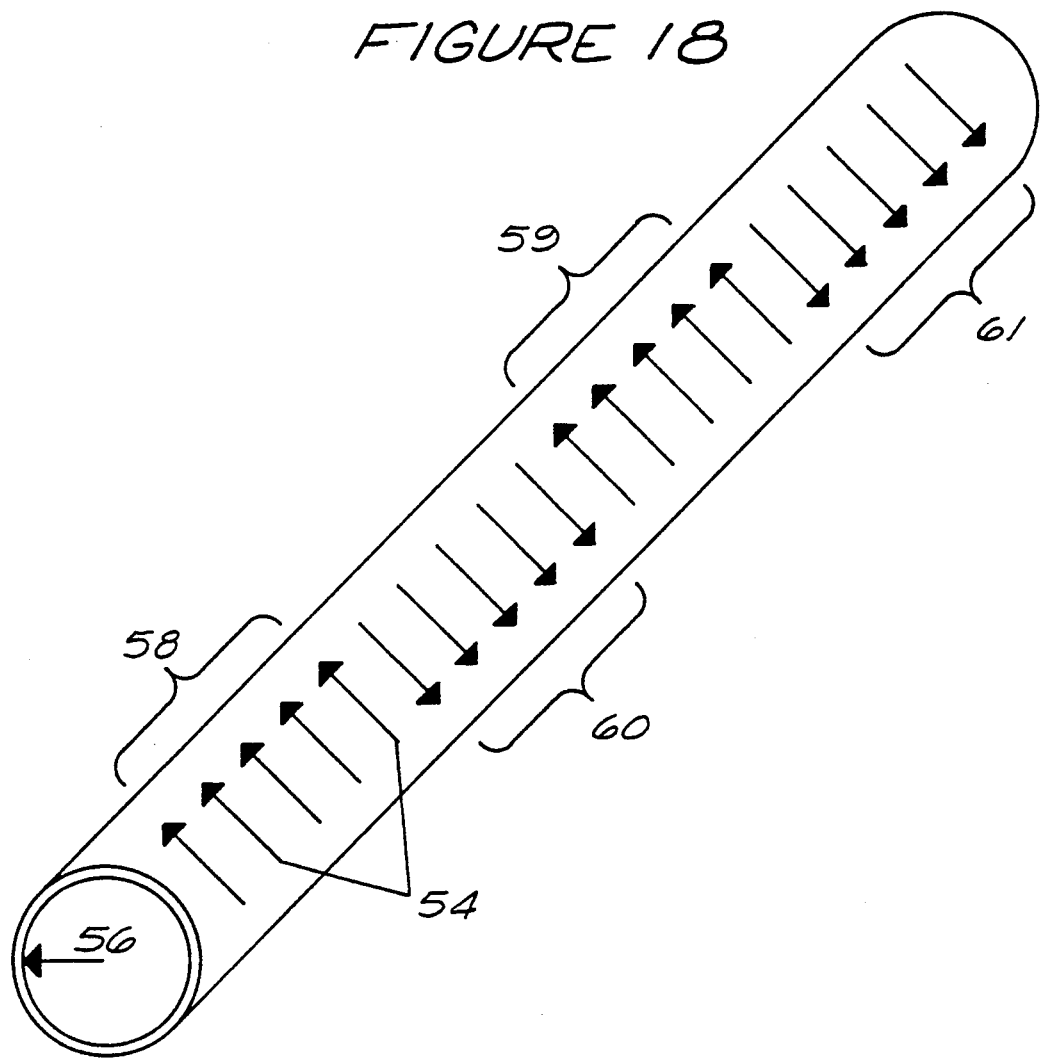
FIG. 19 is an isometric view of extruded plastic pipe in which the orientation of the magnetic particles varies in different regions as a means of encoding information.

FIGS. 18 and 19 illustrate how buried pipe such as the one shown in FIG. 17 can be seen, or not seen, with a magnetic detection apparatus sensitive to horizontally oriented magnetic fields, i.e., a "horizontal sensor".

FIG. 18 shows a cross section of the pipe 56 shown in FIG. 17—specifically, a cross section of a region 58 or 59 where the magnetic particles 54 produce a field pointing from right to left. The magnetic field lines then point from left to right above the ground, and a horizontal sensor will detect them without difficulty.

FIG. 19 shows a different cross section of the same pipe 56, this time representing a region 60 or 61 in which the magnetic particles 54 produce a field pointing from left to right. The magnetic field lines then point from right to left above the ground. In this case also, they may be detected with a horizontal sensor.

Figure 20:
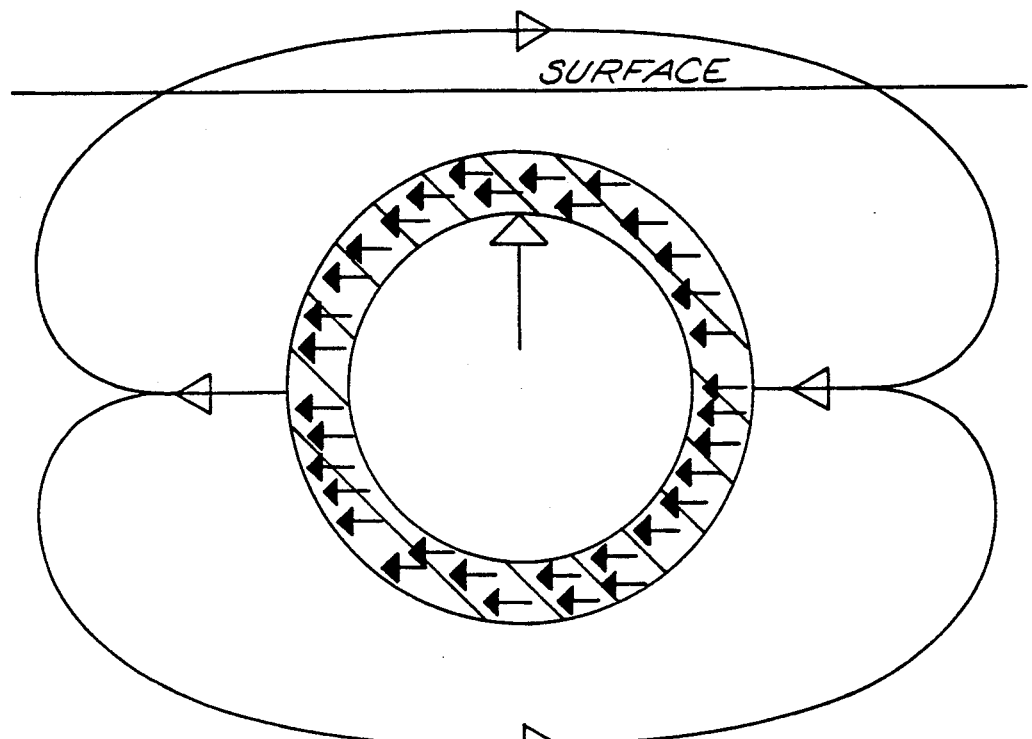
FIG. 20 is a lateral cross section of an extruded plastic pipe containing uniformly dispersed particles of magnetic material, in which the magnetic particles produce a magnetic field pointing from right to left within the diameter of the pipe.

FIG. 20, however, shows a cross section of the same pipe 56 in which the magnetic particles 54 produce a field pointing down. In this case, the magnetic field lines are vertical at the surface, and a horizontal sensor will not sense them. The same problem would occur, of course, if the magnetic particles produced a field pointing up.

If a vertical detector is used, i.e., one which is oriented to vertical magnetic fields, then it would detect a pipe oriented as in FIG. 20, but would not see the pipe oriented as in FIGS. 18 and 19 in a horizontal direction.

PIPES HAVING THE DIRECTION OF THE MAGNETIZATION SPIRALLED

Figure 21:
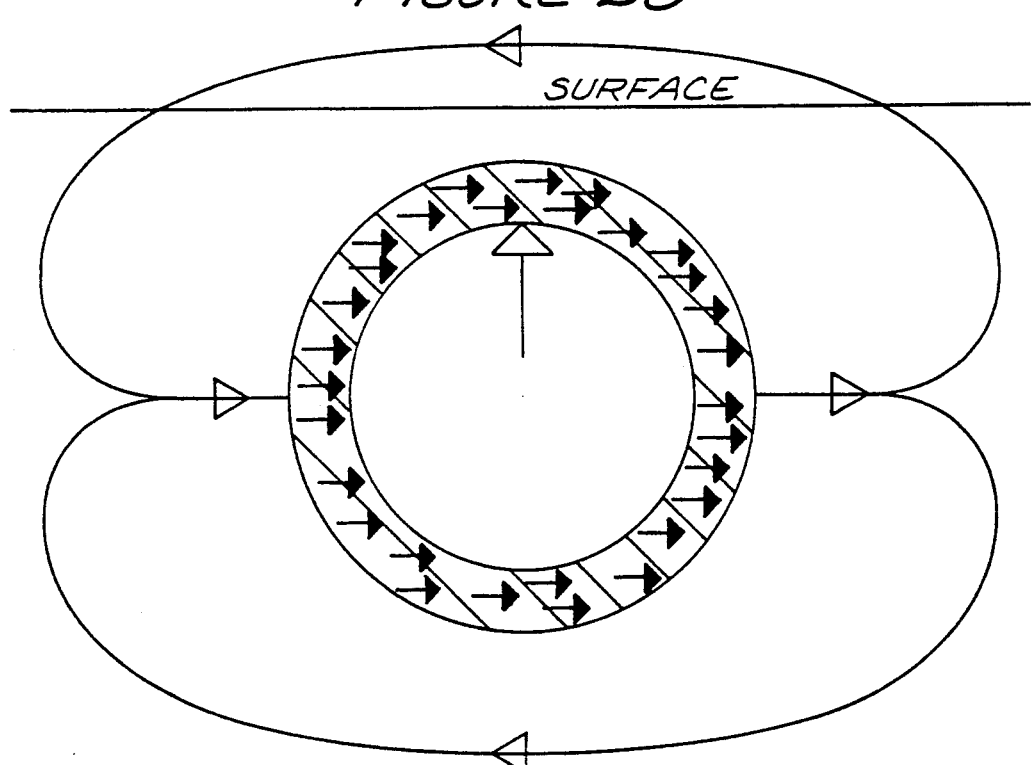
FIG. 21 is a lateral cross section of an extruded plastic pipe containing uniformly dispersed particles of magnetic material, in which the magnetic particles produce a magnetic field pointing from left to right within the diameter of the pipe.

In the Goodman system of magnetizing the pipe, the pipe is not required to be laid with a specific orientation. In FIG. 21, a plastic pipe 56 has the direction of alignment of the magnetic particles 54 spiraled along the length of the pipe. Throughout the pipe 56, the particles 54 are magnetized along the diameter of the pipe, so that the particle magnetization is perpendicular to the wall of the pipe, but the orientation of the magnetization rotates continuously as the pipe length is traversed. This pipe 56 is useful in that the magnetic detection process does not depend on the pipe orientation. The pipe can be buried in any orientation without affecting its basic magnetic signature.

One method of creating such a pipe involves continuously rotating the magnetizer 57 (FIG. 14) as the pipe is extruded or if the magnetization is done after the pipe is cut to length, the pipe can be rotated and the magnetizer 57 kept stationary. In another magnetization procedure, the magnet 57 may rotate (oscillate) continuously back and forth, producing a reversing spiral.

Figure 22:
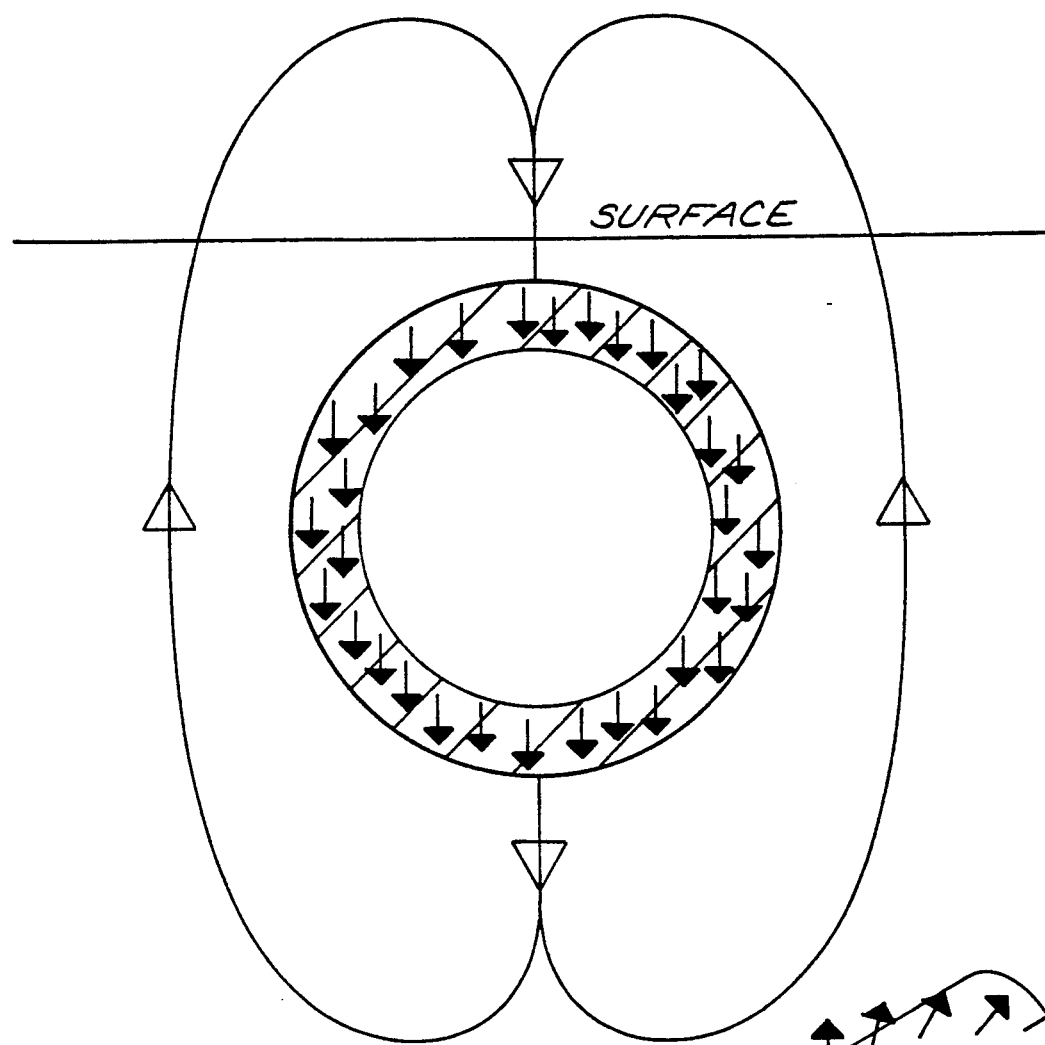
FIG. 22 is a lateral cross section of an extruded plastic pipe containing uniformly dispersed particles of magnetic, in which the magnetic particles produce a magnetic field pointing from top to bottom within the diameter of the pipe.

If one walked along this buried pipe 56 with a vertical or horizontal sensor, the magnetic signal at the surface would rise to a positive peak, fall to zero, sink to a negative peak, rise to zero, and then repeat in a regular pattern. This pattern is shown in FIG. 22, a plot of vertical magnetic field intensity as a function of linear displacement along the pipe. A magnetic sensing apparatus on the surface can display this regular pattern by visual or audible signals.

It is also possible to encode the size of the pipe into the frequency, or period, of the spiralling. The period of the spiralling should be long compared to the depth of the pipe in order to avoid errors in reading caused by cancellation of adjacent magnetic field lines. Since larger pipes are usually buried deeper, one reasonable possibility is to use a 40" period for pipes 4" in diameter, a 20' period for pipes 2" in diameter, etc.

Let us assume the magnetization of each size of pipe is determined or known. Once the observer above ground ascertains the diameter of the pipe from the length of the period, he can then calculate the depth of the pipe from the measured magnetic field strength at the surface. The magnetic sensing apparatus described above displays this information automatically.

DETERMINATION OF DISTANCE TO BURIED PIPE

When the pipe is magnetized to a known constant magnetic field strength, the detectors described above can be used to measure distance to buried pipe. When the field strength is measured at the surface, the depth of the pipe can be calculated—or the apparatus can calculate it automatically.

USE OF THE HAND-HELD MAGNETIC LOCATOR

The hand-held magnetic locator shown in FIGS. 1-3 is designed and sized for carrying in one hand. The structure is balanced so that when it is carried by handle 18 the sensor tube or gradiometer 10 is supported in a vertical position at a substantial distance ahead of the operator. This ensures that the gradiometer will not be influenced by magnetic objects on the person of the operator, e.g., nails in shoes, keys, chains, belt buckles, etc., which may distort the reading. The locator is a single axis instrument which senses the magnitude and direction (up or down) of a magnetic field vector.

The user first searches with the instrument until a signal is found. After a pipe has been located by the magnetic locator just described, the user moves the instrument around the area to determine is the signature resembles that of the plastic pipe, i.e., he looks for alternating polarity with a zero in between. The pipe orientation is determined and then a traverse made along the length of the pipe. During the traverse, several positive and negative maxima and minima of magnetic signal separated by null values are detected.

If the buried object has the proper signature, the user determines the pitch of magnetization by either measuring the distance between peaks of the same polarity or measuring the distance between zeros or null points. The distance between null points is measured and the pipe diameter determined from this information. Distance between null points may be manually measured or measured by instrument such as the wheel of the magnetic mapper.

Once the distance between the null points is known, the pipe diameter is determined by a microprocessor (microchip computer) within the locator electronics and the read-out given by digital or analog display on display module 19. User may consult a chart which determines pipe diameter from pitch of the magnetic signature. He may key in the pipe size from the chart, which will register on the LCD, or, in an improved embodiment could key in the pitch which would display both the pitch and pipe diameter on the LCD. Finally, the user moves the instrument to a point over the pipe with the maximum positive or negative polarity and presses the depth button on the module 19. Depth is calculated from maximum signal strength.

Detector tube 10 or gradiometer has the sensors 11 and 12 zeroed at the time of manufacture to eliminate the effect of the earth's magnetic field. As noted above, detector tube 10 is supported by hollow supporting tube 17 and handle 18 in a vertical position at a substantial distance ahead of the operator which isolates the gradiometer from magnetic interference originating with the user or operator. As the operator moves the gradiometer 10 over the surface of the ground, when the gradiometer 10 is positioned near a magnetized object, the lower sensor 11 measures an appreciably larger field than the upper sensor 12 sensing a magnetic field gradient which is a measure of the intensity of the field (a function of the strength of the magnetized object and its distance).

The digital circuit described above processes the net signal, after subtraction, to determine strength and polarity of the field and display the output to the user. The connection from gradiometer 10 is to an A/D converter 32 which converts the fluctuating signal to a digital output. The output from A/D converter 32 is fed to microprocessor 33 connected to speaker 34 (for audible signal), LCD bar graph (for visual read-out) and depth read-out 20 and keyboard 35. Speaker 34 has two distinct tones to indicate a north or a south magnetic pole. The bar graph also registers polarity (to the left or right of center) and also magnitude of the sensed magnetic field.

The measurement of pipe depth is calculated by the computer chip based on the formula: Depth $D''=K_1 \times [A/D \text{ Counts}]^{-K_2}$. In this equation, the constants $K_1$ and $K_2$ are determined empirically for known loading of magnetic particles and strength of the magnetic field for a given pipe size. For a 2.375" O.D. polyethylene pipe loaded with 3.5% barium ferrite, $K_1=299.83$ and $K_2=0.31942$. The read-out is given on the read-out 20 (module 19) on pressing the designated button (switch) on keyboard 35.

USE OF THE WHEELED MAGNETIC FIELD MAPPER

The wheeled magnetic field mapping apparatus 36 (FIGS. 4–8) moves an array of gradiometers 10 in parallel relation. The mapper 36 comprises a two-wheeled (or three-wheeled) card supports the array of gradiometer 10 and a laptop or notebook size personal computer 46. As the cart advances, the computer samples each sensor in the gradiometer array and displays the result on the computer screen as a contour map. The contour map scrolls across the screen in concert with the motion of the cart and provides the operator with a real-time image of the magnetic field anomalies.

The multi-channel mapper 36 was developed specifically to locate buried magnetic polyethylene gas pipe. The characteristic magnetic signal from the spirally magnetized plastic pipe (as described above) is automatically detected and the computer traces the extent of the pipe across the screen. Pipe size and burial depths are automatically calculated by the formula given above and displayed.

Figure 23:
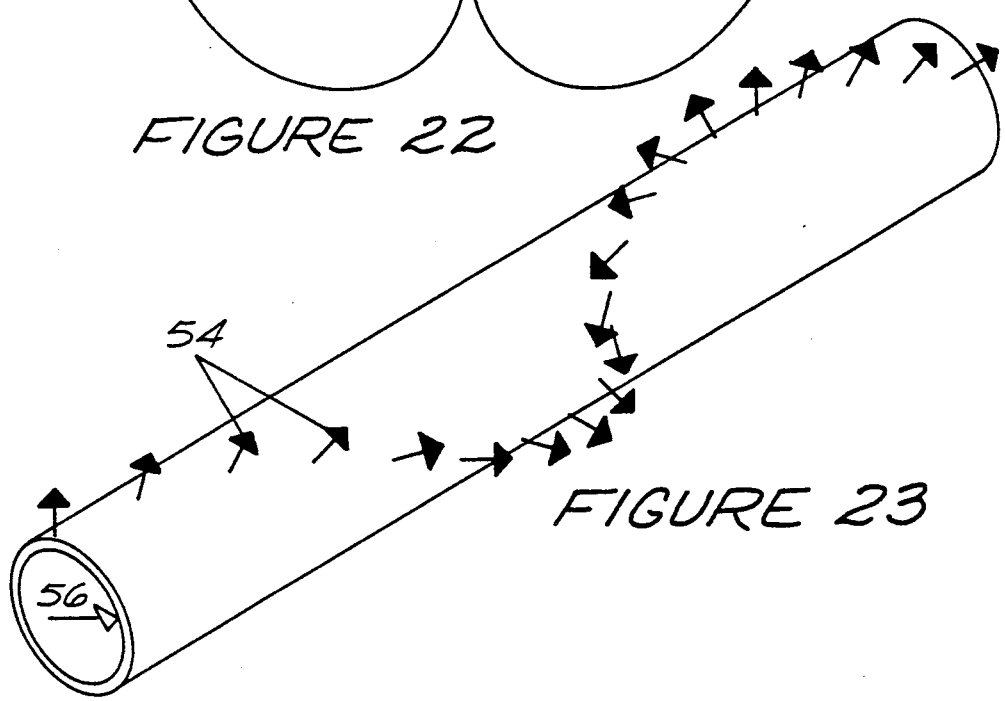
FIG. 23 is an isometric view of a plastic pipe which is magnetized across its diameter in a spiraled pattern, the period of the spiral being a means of encoding information.
Figure 24:
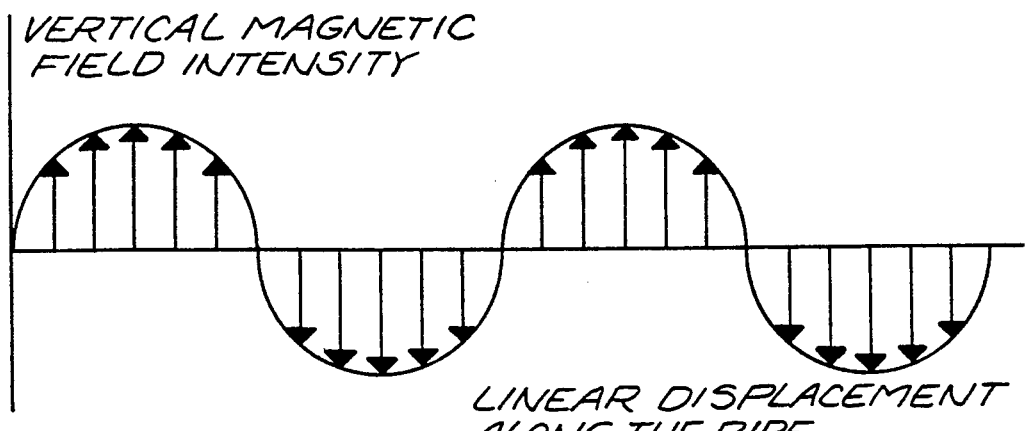
FIG. 24 is a plot of vertical magnetic field gradient intensity as a function of linear distance along the pipe shown in FIG. 23.
Figure 25:
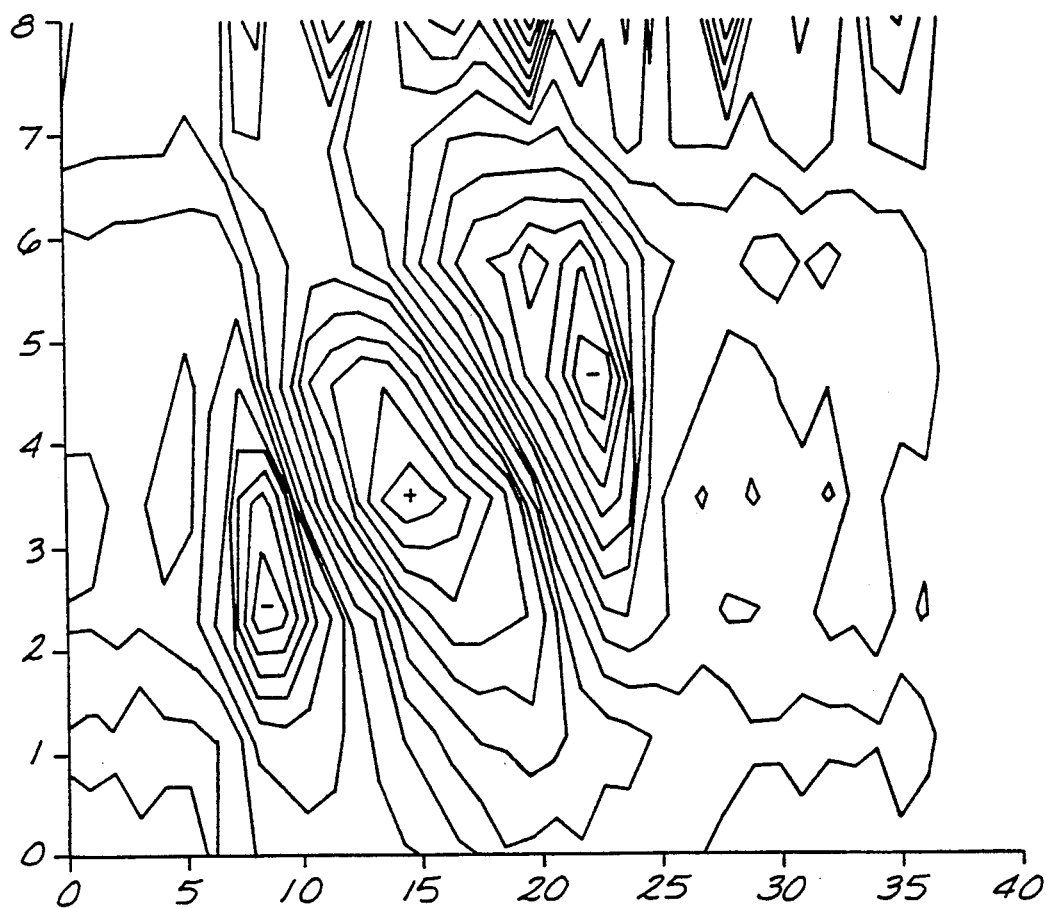
FIG. 25 is a magnetic field gradient contour map generated by the mapping apparatus of FIGS. 5 and 6 swept over a length of spirally magnetized plastic pipe.
Figure 26:
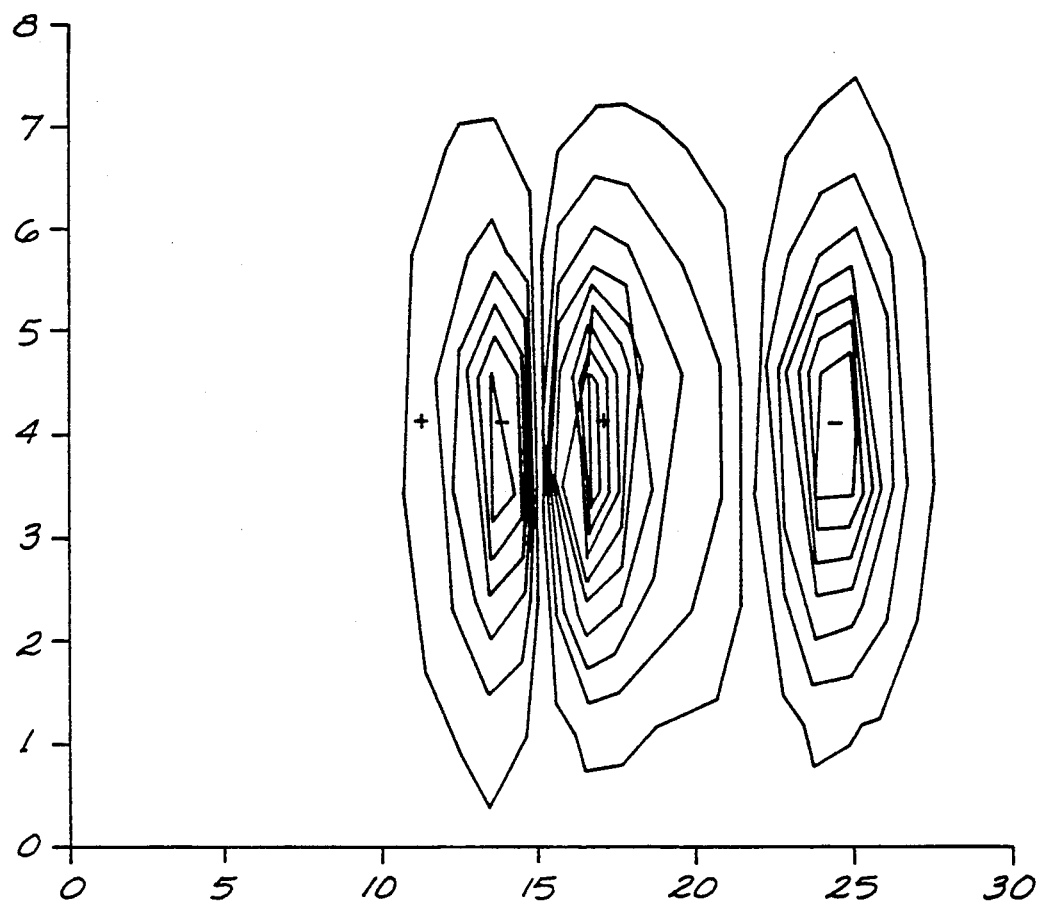
FIG. 26 is a magnetic field gradient contour map generated by the mapping apparatus of FIGS. 5 and 6 swept over a length of cast iron pipe.
Figure 27:
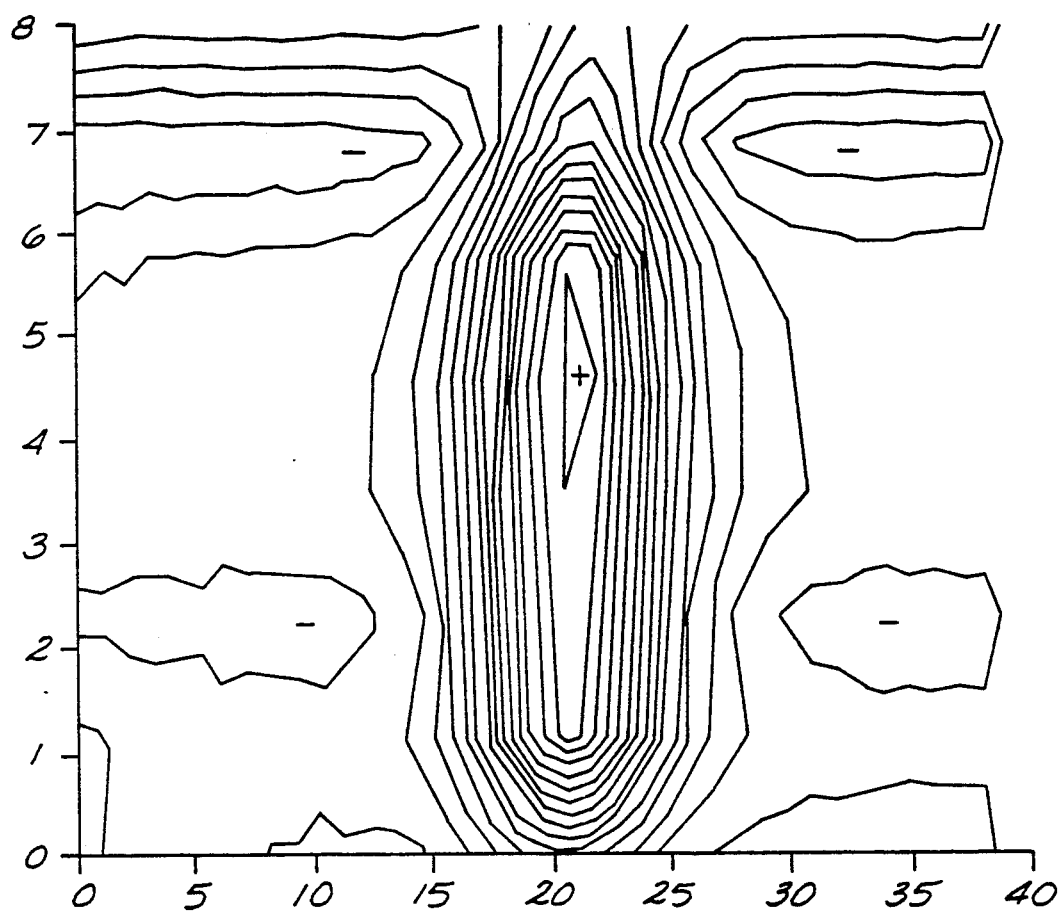
FIG. 27 is a magnetic field contour map generated by the mapping apparatus of FIGS. 5 and 6 swept over a length of concrete reinforcement bar.

FIGS. 23–25 are examples of actual contoured images obtained by mapper 36.

FIG. 23 shows a traverse taken over a 20 foot length of spirally wound 2.375" O.D. plastic pipe with a 3.5% loading of barium ferrite magnetized as described above. The distinctive anomaly pattern consists of two peaks of negative polarity and one peak of positive polarity. From the wavelength of the spiral, the diameter of the pipe can be determined and the depth of the pipe calculated as described.

FIG. 24 is a traverse from left to right over a 14 foot length of 7" cast iron pipe. Both ends of the pipe produce prominent anomalies and there is an anomaly between the ends associated with a bell joint.

FIG. 25 shown a magnetic anomaly produced by a reading taken on a length of reinforcement bar embedded in concrete. This anomaly is representative of magnetic noise which may be encountered.

USE OF THE HAND-HELD MAGNETIC FIELD MAPPER

The hand-held magnetic field mapping apparatus 110 (FIGS. 10–11) moves an array of flux-gate sensors 112 in parallel relation along with reference sensor 114. The mapper 110 is hand-held by handle 117 an swept from side to side as the operator walks along the path being surveyed. Each sensor 112 in the gradiometer array is referenced against reference sensor 114 and the output signals passed through the microprocessor and the result shown on the display screen 119. The display shown provides a real-time image of the magnetic field anomalies.

The hand-held multi-channel mapper 110 was developed specifically to locate buried magnetic polyethylene gas pipe. The characteristic magnetic signal from the spirally magnetized plastic pipe (as described above) is automatically detected and the computer traces the extent of the pipe across the screen. Pipe size and burial depths are automatically calculated by the formula given above and displayed.

While this invention has been described fully and completely with special emphasis on certain preferred embodiments, it should be understood that within the scope of the appended claims the invention may be practiced otherwise than as specifically described.

What is claimed is:

1. A hand-held apparatus for manipulation by an operator for detecting magnetically detectable plastic pipe and other sources of magnetic fields from a distance comprising
   a horizontally oriented support member having a handle extending at an acute angle therefrom,
   a magnetic field gradiometer supported at the distal end of said support member a substantial distance ahead of the operator in a substantially vertical position,
   said gradiometer comprising a hollow tube of non-magnetic material having flux-gate magnetometer sensors supported therein at a selected linear spacing, and
   a differential amplifier connected to said flux-gate magnetometer sensors to subtract the signal produced and zero out the effect of the earth's magnetic field in a magnetically neutral environment, and detect a magnetic field gradient when placed in proximity to a magnetic field,
   a microprocessor supported on said support member operatively connected to said gradiometer for processing signals therefrom, and
   an electronic read-out module supported on said handle spaced from said gradiometer and operable to receive signals from said microprocessor and convert them into a visual and audible display to be sensed by the operator or user,
   the size and weight distribution of said apparatus and the angles at which the components are assembled cooperate to assure that when the apparatus is hand held by said handle said gradiometer is balanced in a vertical position at a substantial distance ahead of the operator or user.

2. A magnetic field detecting apparatus according to claim 1 in which
   said read-out module provides an audible and a visual display and has a speaker,
   an open display panel, and
   push button switches for volume, range, power on/off, zero for zeroing the instrument in a magnetically neutral environment, mode and depth along an edge portion of said module.

3. A magnetic field detecting apparatus according to claim 1 including
   an A/D converter connected to receive a fluctuating signal from said gradiometer and convert same to a digital output to said microprocessor, and
   said microprocessor produces a signal driving said read-out module.

4. An apparatus for manipulation by an operator for detecting magnetically detectable plastic pipe and other sources of magnetic fields from a distance comprising
   a horizontally oriented support member,
   a first hollow tube of non-magnetic material constructed to be held by said support member in a horizontal position,
   a plurality of flux-gate magnetometer sensors, and at least one reference flux-gate magnetometer sensor, supported on said hollow tube at selected linear spacing a substantial distance ahead of the operator in a substantially vertical position,
   a second hollow tube of non-magnetic material integral with an extending at a right angle to said first tube and including a flux-gate magnetometer sensor spaced vertically above said first named magnetometer sensors,
   at least one microprocessor operatively connected to said sensors for processing signals therefrom,
   an electronic read-out module supported on said support member spaced from said gradiometers and operable to receive signals from said microprocessor and convert them into a sensory display to be sensed by the operator,
   a plurality of differential amplifiers connected one to each of said flux-gate magnetometer sensors and to said vertically spaced sensor to subtract the signals produced and zero out the effect of the earth's magnetic field in a magnetically neutral environment, and detect a magnetic field gradient when placed in proximity to a magnetic field, and
   a flux-gate compass supported in said second hollow tube to measure and record movement of said support member from side to side.

5. A magnetic field detecting apparatus according to claim 4 for mapping magnetic fields from a distance in which
   said support member is constructed and adapted to be held by the hands of an operator and operated by sweeping said sensors from side to side as the operator advances.

6. A magnetic field detecting apparatus according to claim 4 for mapping magnetic fields from a distance including
   a pair of wheels operatively supporting said support members for wheeling said apparatus along the surface of the ground.

7. A magnetic field detecting apparatus for manipulation by an operator for detecting magnetically detectable plastic pipe and other sources of magnetic fields from a distance comprising
   a plurality of horizontally oriented, substantially parallel, support members,
   a pair of wheels operatively supporting said support members for wheeling said apparatus along the surface of the ground,
   a plurality of magnetic field gradiometers, one of each being supported at the distal end of respective ones of said support members a substantial distance ahead of the operator in a substantially vertical position,
   said gradiometers are each enlarged at their upper ends and are split and openable,
   circuit boards for each gradiometer positioned in said enlarged upper ends,
   a plurality of microprocessors operatively connected one to each of said gradiometers for processing signals therefrom, and
   an electronic read-out module supported on said support member spaced from said gradiometers and operable to receive signals from said microprocessors and convert them into a sensory display to be sensed by the operator, said read-out module comprising a laptop or notebook size computer providing a contour map of magnetic field intensity versus distance traveled on the screen thereof.

8. A magnetic field detecting apparatus according to claim 7 for mapping magnetic fields from a distance comprising
three wheels operatively supporting said support members for wheeling said apparatus along the surface of the ground with said gradiometers supported in a substantially vertical position.

9. A magnetic field detecting apparatus according to claim 7 for mapping magnetic fields from a distance in which
each of said gradiometers has its output signal connected to said circuit boards in the enlarged upper ends thereof for converting the signals from said gradiometers to visual or audible output or to distance measurement,
an A/D converter connected to each gradiometer to convert the fluctuating signal therefrom to spaced counts,
a microprocessor connected to each A/D converter and to a serial port of said computer, having a speaker for audible signal, LCD, or the like, yielding a visual read-out and depth read-out.

10. A magnetic field detecting apparatus according to claim 7 for mapping magnetic fields from a distance in which
each of said gradiometers has its output signal connected to said circuit boards in the enlarged upper ends thereof for converting the signals from said gradiometers to visual or audible output or to distance measurement,
an A/D converter connected to each gradiometer to convert the fluctuating signal therefrom to spaced counts,
a microprocessor connected to each A/D converter and to a serial port of said computer, having a speaker for audible signal, LCD, or the like, yielding a visual read-out and depth read-out, and
said computer having a keyboard supplying the required commands for the display desired.

11. A method of detecting magnetically detectable plastic pipe having a characteristic signature thereon from a distance comprising providing a magnetic field detection apparatus comprising
a horizontally oriented support member,
a magnetic field gradiometer supported at the distal end of said support member a substantial distance ahead of the operator in a substantially vertical position,
a microprocessor supported on said support member operatively connected to said gradiometer for processing signals therefrom, and
an electronic read-out module supported on said support member spaced from said gradiometer and operable to receive signals from said microprocessor and convert them into a sensory display to be sensed by the operator or user,
moving said apparatus over a selected area with said gradiometer held a substantial distance ahead of the operator in a substantially vertical position until a magnetic field is detected,
then moving said apparatus around the area to determine whether the field has a signature resembling that of said plastic pipe,
determining orientation of said pipe by locating alternating polarity with a zero in between and making a traverse along the length of said pipe,
during said traverse, detecting several positive and negative maxima and minima of magnetic signal separated by null values, and measuring the pitch of said magnetic signal, and
processing said signal by said microprocessor and producing a read-out on said display module.

12. A method according to claim 11 including the steps of then determining pipe diameter from pitch of the magnetic signature,
moving said gradiometer to a point over the pipe with the maximum positive or negative polarity, and
calculating depth of said pipe from maximum signal strength.

13. A method according to claim 12 including the steps of then
calculating pipe depth by said microprocessor utilizing the formula:
Depth $D'' = K_1 \times [A/D\ Counts]^{-K_2}$, where the constants $K_1$ and $K_2$ are determined empirically for known loading of magnetic particles and strength of the magnetic field for a given pipe size, and
producing a read-out on said module by pressing the designated switch on said computer keyboard.

14. A method according to claim 12 for mapping magnetic fields from a distance comprising providing
a plurality of horizontally oriented, substantially parallel, support members,
a plurality of magnetic field gradiometers, one of each being supported at the distal end of respective ones of said support members a substantial distance ahead of the operator in a substantially vertical position,
a plurality of microprocessors operatively connected one to each of said gradiometers for processing signals therefrom, and
an electronic read-out module supported on said support member spaced from said gradiometers and operable to receive signals from said microprocessors and convert them into a sensory display to be sensed by the operator, and
moving said apparatus over a selected area with said gradiometer held a substantial distance ahead of the operator in a substantially vertical position until a magnetic field is detected,
then moving said apparatus around the area to determine whether the field has a signature resembling that of said plastic pipe,
determining orientation of said pipe by locating alternating polarity with a zero in between and making a traverse along the length of said pipe,
during said traverse, detecting several positive and negative maxima and minima of magnetic signal separated by null values, and measuring the pitch of said magnetic signal, and
processing said signal by said microprocessor and producing a read-out on said display module.

15. A method according to claim 14 for mapping magnetic fields from a distance in which
said apparatus has at least two wheels operatively supporting said support members for wheeling said apparatus along the surface of the ground.

16. A method according to claim 14 for mapping magnetic fields from a distance in which
   said gradiometers are each enlarged at their upper ends and are split and openable,
   circuit boards are provided for each gradiometer positioned in said enlarged upper ends, and
   said read-out module comprising a laptop or notebook size computer providing a contour map of magnetic field intensity versus distance traveled on the screen thereof.

17. A method according to claim 16 for mapping magnetic fields from a distance in which
   each of said gradiometers has its output signal connected to said circuit boards in the enlarged upper ends thereof for converting the signals from said gradiometers to visual or audible output or to distance measurement, and including
   an A/D converter connected to each gradiometer to convert the fluctuating signal therefrom to spaced counts,
   a microprocessor connected to each A/D converter and to a serial port of said computer, having a speaker for audible signal, LCD, or the like, yielding a visual read-out and depth read-out.

18. A method according to claim 16 for mapping magnetic fields from a distance in which
   each of said gradiometers has its output signal connected to said circuit boards in the enlarged upper ends thereof for converting the signals from said gradiometers to visual or audible output or to distance measurement, and including
   an A/D converter connected to each gradiometer to convert the fluctuating signal therefrom to spaced counts,
   a microprocessor connected to each A/D converter and to a serial port of said computer, having a speaker for audible signal, LCD, or the like, yielding a visual read-out and depth read-out, and
   said computer having a keyboard supplying the required commands for the display desired.

* * * * *